(12) United States Patent
Chang et al.

(10) Patent No.: US 9,117,655 B2
(45) Date of Patent: Aug. 25, 2015

(54) SEMICONDUCTOR DEVICE

(75) Inventors: Dong-Ryul Chang, Suwon-si (KR);
Hwa-Sook Shin, Hwaseong-si (KR)

(73) Assignee: SAMSUNG Electronics Co., Ltd.,
Suwon-si (KR)

( * ) Notice: Subject to any disclaimer, the term of this patent is extended or adjusted under 35 U.S.C. 154(b) by 226 days.

(21) Appl. No.: 13/537,692

(22) Filed: Jun. 29, 2012

(65) Prior Publication Data
US 2013/0001672 A1    Jan. 3, 2013

(30) Foreign Application Priority Data
Jul. 1, 2011    (KR) ........................ 10-2011-0065691

(51) Int. Cl.
| | |
|---|---|
| *H01L 29/49* | (2006.01) |
| *H01L 27/02* | (2006.01) |
| *H01L 21/28* | (2006.01) |
| *H01L 29/788* | (2006.01) |
| *H01L 27/115* | (2006.01) |

(52) U.S. Cl.
CPC ...... *H01L 27/0207* (2013.01); *H01L 21/28273* (2013.01); *H01L 27/11519* (2013.01); *H01L 27/11526* (2013.01); *H01L 29/7881* (2013.01)

(58) Field of Classification Search
USPC ............................................. 365/185.05, 184
See application file for complete search history.

(56) References Cited

U.S. PATENT DOCUMENTS

| | | | |
|---|---|---|---|
| 7,078,761 B2 | 7/2006 | Wang et al. | |
| 7,339,229 B2 | 3/2008 | Wang et al. | |
| 7,663,916 B2 | 2/2010 | Chih et al. | |
| 7,839,683 B2 * | 11/2010 | Oka et al. ................. | 365/185.08 |
| 8,559,223 B2 * | 10/2013 | Takashima ............... | 365/185.05 |
| 8,779,497 B2 * | 7/2014 | Choi ............................. | 257/315 |
| 2011/0140202 A1 * | 6/2011 | Park et al. ..................... | 257/371 |

FOREIGN PATENT DOCUMENTS

| | | |
|---|---|---|
| JP | 2005-252267 | 9/2005 |
| JP | 2008-270708 | 11/2008 |
| KR | 100667898 | 1/2007 |

* cited by examiner

*Primary Examiner* — Michael Shingleton
(74) *Attorney, Agent, or Firm* — Ellsworth IP Group PLLC

(57) ABSTRACT

A semiconductor device includes a main active region provided in a semiconductor substrate and having a first side surface and a second side surface facing each other. A first auxiliary active region adjacent the first side surface of the main active region and spaced apart from the main active region by a first distance is provided. A second auxiliary active region adjacent the second side surface of the main active region and spaced apart from the main active region by the first distance is provided. A first conductive pattern crosses the main active region and includes first and second side portions facing each other. The first side portion of the conductive pattern is disposed between the first auxiliary active region and the main active region, and the second side portion of the conductive pattern is disposed between the second auxiliary active region and the main active region.

20 Claims, 22 Drawing Sheets

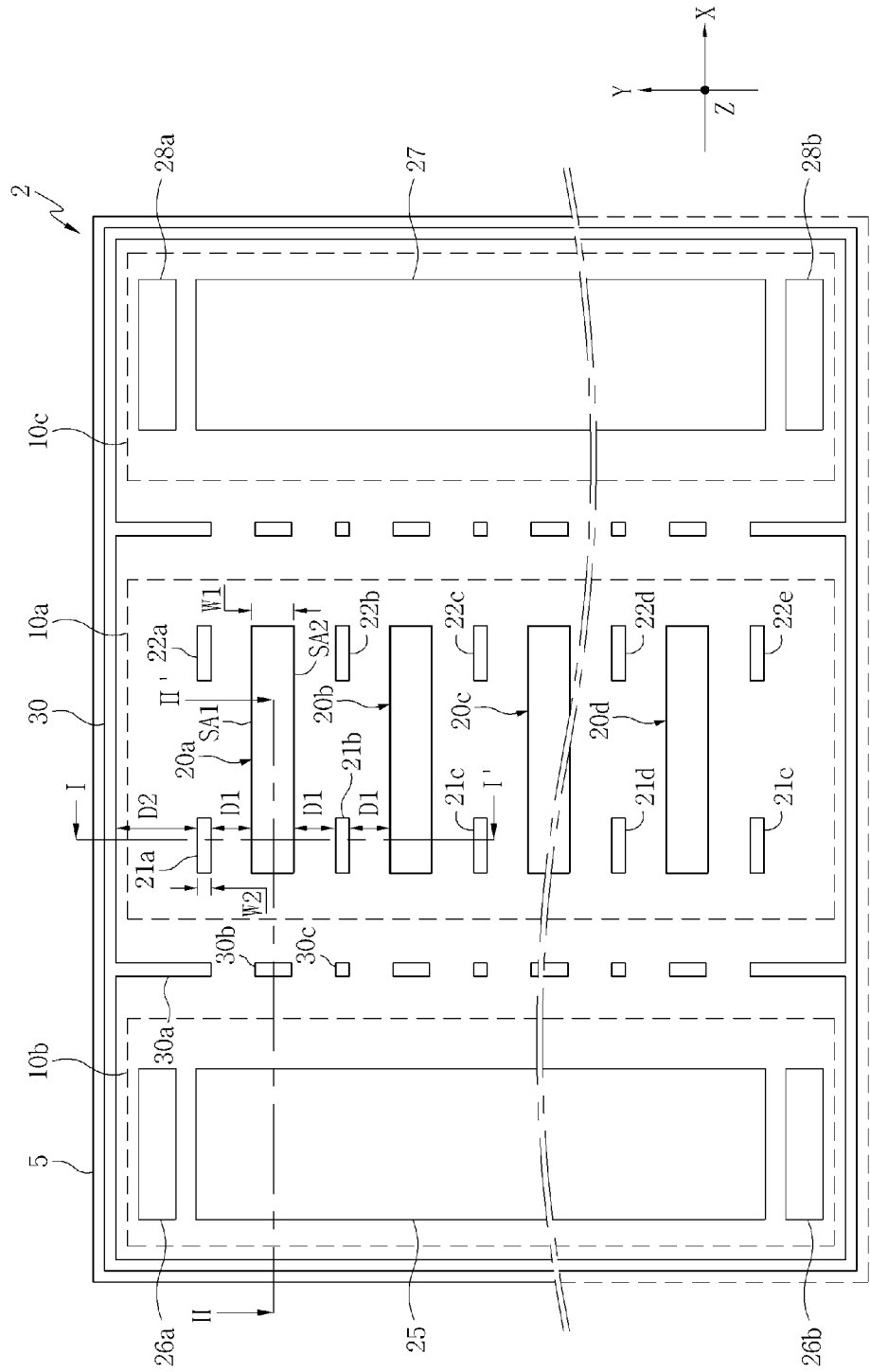

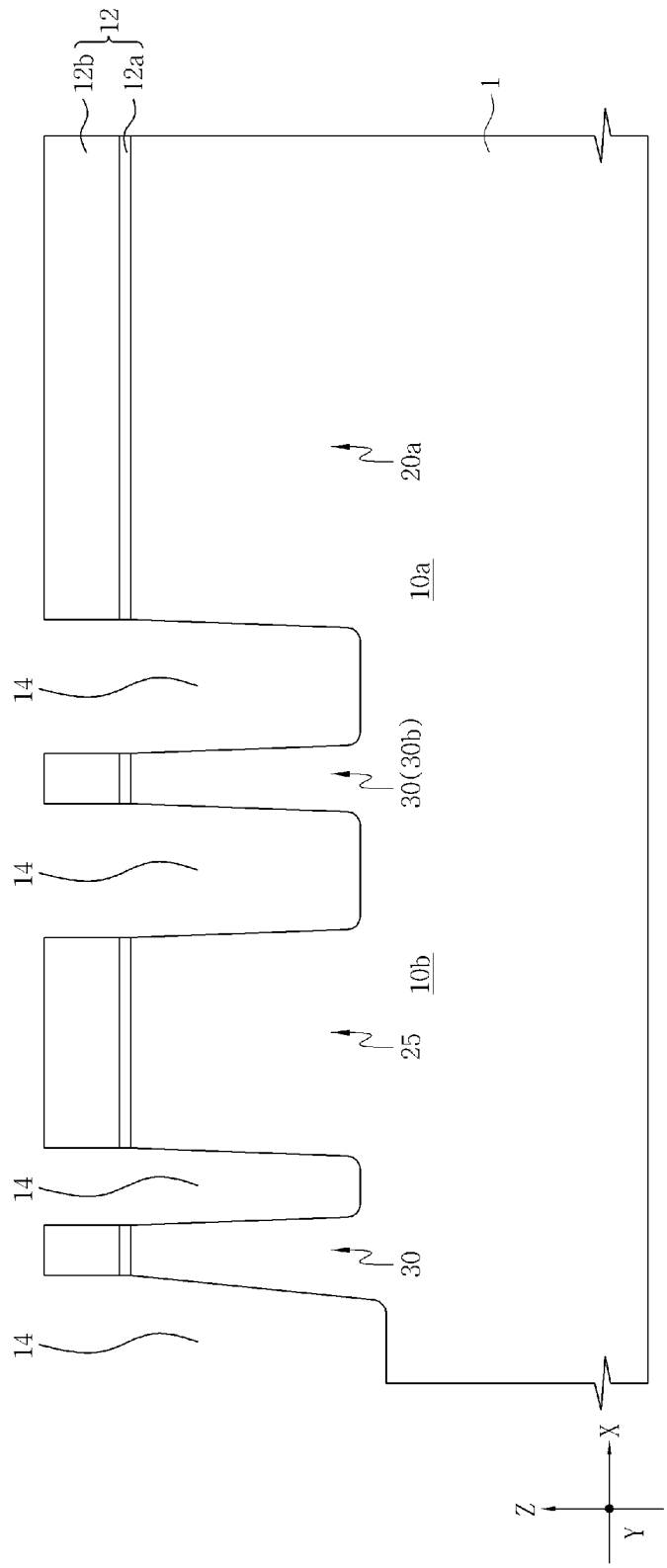

SEMICONDUCTOR DEVICE

CROSS-REFERENCE TO RELATED APPLICATIONS

This application claims priority under 35 U.S.C. §119 from Korean Patent Application No. 10-2011-0065691 filed on Jul. 1, 2011, filed in the Korean Intellectual Property Office, the disclosure of which is hereby incorporated by reference in its entirety.

BACKGROUND

1. Field

The general present general inventive concept relates to a semiconductor device, an electronic part having the semiconductor device, an electronic product and electronic system employing the electronic part.

2. Description of the Related Art

In a semiconductor device, a non-volatile device such as an electrically erasable programmable read-only memory (EEPROM) has been used for various electronic products.

SUMMARY

Exemplary embodiments of the present general inventive concept provide a new cell layout structure capable of increasing reliability of a non-volatile memory device.

Exemplary embodiments of the present general inventive concept also provide a non-volatile memory device having a new cell layout structure.

Exemplary embodiments of the present general inventive concept further provide a method of fabricating a non-volatile memory device having a new cell layout structure.

Exemplary embodiments of the present general inventive concept provide an electronic device and product employing a non-volatile memory device having a new cell layout structure.

Problems to be resolved in the present general inventive concept are not limited to the above, and other problems that are not described may be apparently understood by one of ordinary skill in the art based on the following descriptions.

Additional features and utilities of the present general inventive concept will be set forth in part in the description which follows and, in part, will be obvious from the description, or may be learned by practice of the present general inventive concept.

In accordance with a feature of the present general inventive concept, a semiconductor device is provided. The semiconductor device includes a main active region provided in a semiconductor substrate and having a first side surface and a second side surface facing each other. A first auxiliary active region adjacent to the first side surface of the main active region and spaced apart from the main active region by a first distance is provided. A second auxiliary active region adjacent to the second side surface of the main active region and spaced apart from the main active region by the first distance is provided. A first conductive pattern crossing the main active region is provided. The conductive pattern has first and second side portions facing each other. The first side portion of the conductive pattern is disposed between the first auxiliary active region and the main active region, and the second side portion of the conductive pattern is disposed between the second auxiliary active region and the main active region.

In at least one exemplary embodiment, the first or second auxiliary active region may have a different width from the main active region.

In other exemplary embodiments, a width in a first direction of the first conductive pattern may be smaller than a width in the first direction of the first auxiliary active region on a planar surface.

In still other exemplary embodiments, the device may further include a control active region spaced apart from the main active region, wherein the main active region and the control active region may be arranged along an X-axis direction, and the first auxiliary active region, the main active region and the second auxiliary active region may be arranged along a Y-axis direction perpendicular to the X-axis direction.

In yet other exemplary embodiments, the device may further include a second conductive pattern crossing the control active region, and a connection pattern electrically connecting the first conductive pattern to the second conductive pattern.

An overlapping region between the second conductive pattern and the control active region may be greater than that between the first conductive pattern and the main active region.

The connection pattern may include a first connection pattern connected to a first end portion of the first conductive pattern, and a second connection pattern connected to a second end portion of the second conductive pattern.

The first connection pattern may connect the first end portion of the first conductive pattern to the second conductive pattern, the second connection pattern may connect the second end portion of the second conductive pattern to the second conductive pattern, and the first and second connection patterns may be parallel to each other.

The connection pattern may further include a third connection pattern between the first connection pattern and the second connection pattern.

In yet other exemplary embodiments, the device may further include a conductive line crossing the main active region and spaced apart from the first conductive pattern.

In yet other exemplary embodiments, the device may further include a tunnel dielectric between the first conductive pattern and the main active region, wherein the tunnel dielectric may include a first tunnel dielectric provided in a middle portion of the main active region, and a second tunnel dielectric provided in an edge portion of the main active region, the first tunnel dielectric being thicker than the second tunnel dielectric.

In accordance with another feature of the present general inventive concept, a semiconductor device defining a plurality of active regions is provided. The semiconductor device includes a first active region provided in a semiconductor substrate and having a first side surface and a second side surface facing each other. A second active region adjacent to the first side surface of the first active region and spaced apart from the first active region by a first distance is provided. A third active region adjacent to the second side surface of the first active region and spaced apart from the first active region by the first distance is provided. A fourth active region disposed opposite to the first active region with the second active region interposed therebetween and adjacent to the second active region is provided. A fifth active region disposed opposite to the second active region with the third active region interposed therebetween and adjacent to the third active region is provided. An isolation region defining the first to fifth active regions is provided. The fourth active region is spaced apart from the second active region by a second distance greater than the first distance, and the fifth active region is spaced apart from the third active region by the first distance.

In some exemplary embodiments, the device may further include first impurity regions provided in an upper region of the first active region and spaced apart from each other, a second impurity region provided in an upper region of the second active region, a third impurity region provided in an upper region of the third active region, a fourth impurity region provided in an upper region of the fourth active region and fifth impurity regions provided in an upper region of the fifth active region, and spaced apart from each other, and a first conductive pattern provided on the first active region between the first impurity regions.

In other exemplary embodiments, the first conductive pattern may be spaced apart from the second and third active regions on a planar surface.

In still other exemplary embodiments, the isolation region may include a first portion between the first active region and the second active region, a second portion between the first active region and the third active region, and a third portion between the second active region and the fourth active region. The first and second active regions adjacent to the first portion of the isolation region may have sidewalls of a first inclination, the first and third active regions adjacent to the second portion of the isolation region may have sidewalls of the first inclination, and the second and fourth active regions adjacent to the third portion of the isolation region may have sidewalls of a second inclination different from the first inclination.

BRIEF DESCRIPTION OF THE DRAWINGS

The foregoing and other features and utilities of the present general inventive concepts will be apparent from the more particular description of exemplary embodiments of the present general inventive concepts, as illustrated in the accompanying drawings in which like reference characters refer to the same parts throughout the different views. The drawings are not necessarily to scale, emphasis instead being placed upon illustrating the principles of the present general inventive concepts. In the drawings:

FIGS. 2A to 2D are plan views of a part of components illustrated in FIG. 1;

FIGS. 9A to 12B are cross-sectional views of a semiconductor device according to exemplary embodiments of the present general inventive concept;

DETAILED DESCRIPTION OF THE EXEMPLARY EMBODIMENTS

Figure 1:
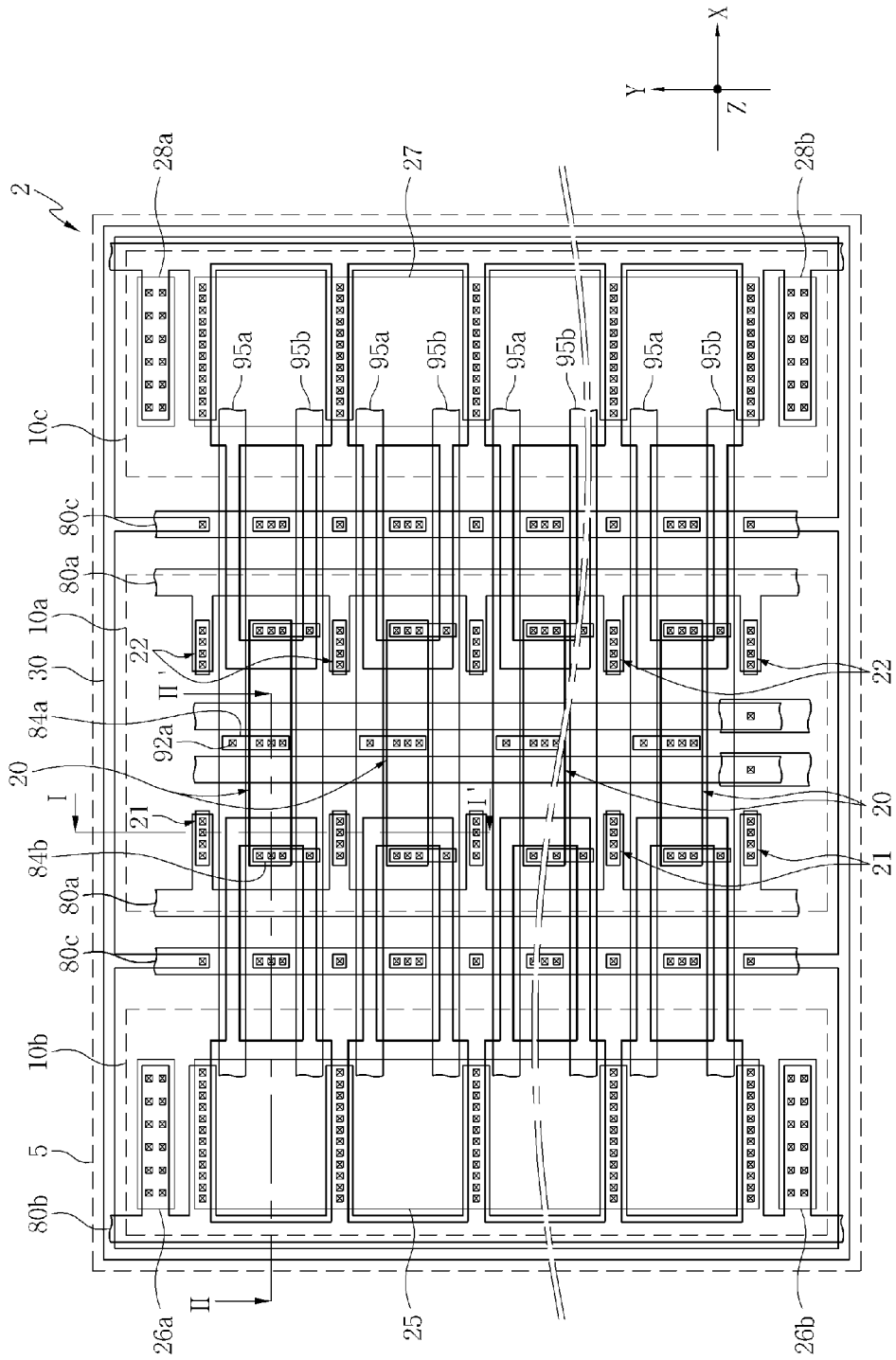
FIG. 1 is a plan view of a semiconductor device according to at least one exemplary embodiment of the present general inventive concept.

Reference will now be made in detail to exemplary embodiments of the present general inventive concept, examples of which are illustrated in the accompanying drawings, wherein like reference numerals refer to the like elements throughout. The exemplary embodiments are described below in order to explain the present general inventive concept while referring to the figures.

Exemplary embodiments of the present general inventive concept may be described with reference to schematic plan views or cross-sectional views, which are schematic diagrams of idealized example embodiments of the inventive disclosure. As such, variations from the shapes of the illustrations, as a result, for example, of manufacturing techniques and/or tolerances, are to be expected. Thus, example embodiments of the inventive disclosure should not be construed as being limited to the particular shapes of regions illustrated herein, but are to include deviations in shapes that result from, e.g., a manufacturing process. Thus, the regions illustrated in the drawings are schematic in nature and are not intended to limit the scope of the present general inventive concept.

Figure 2B:
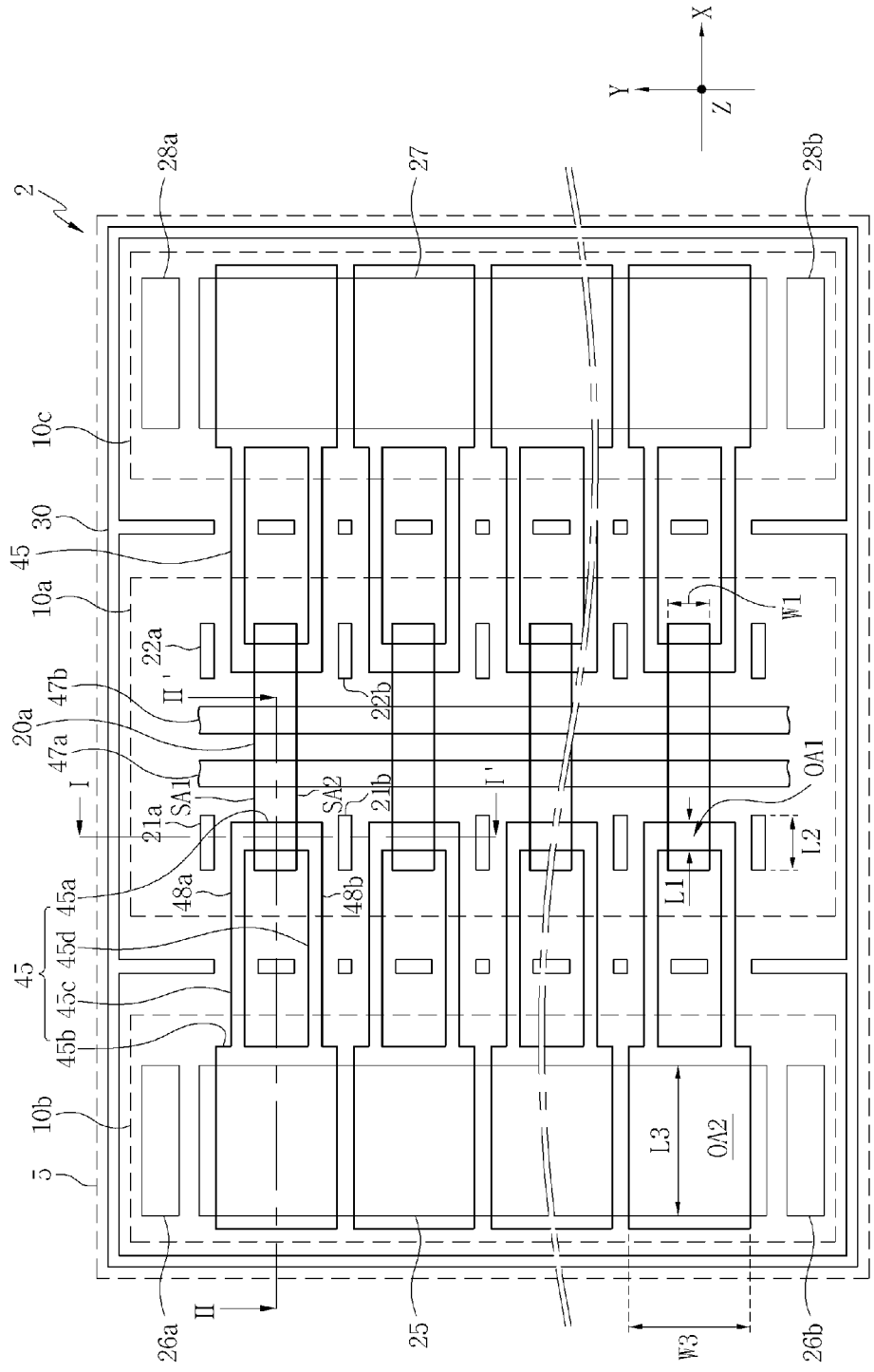
Figure 2C:
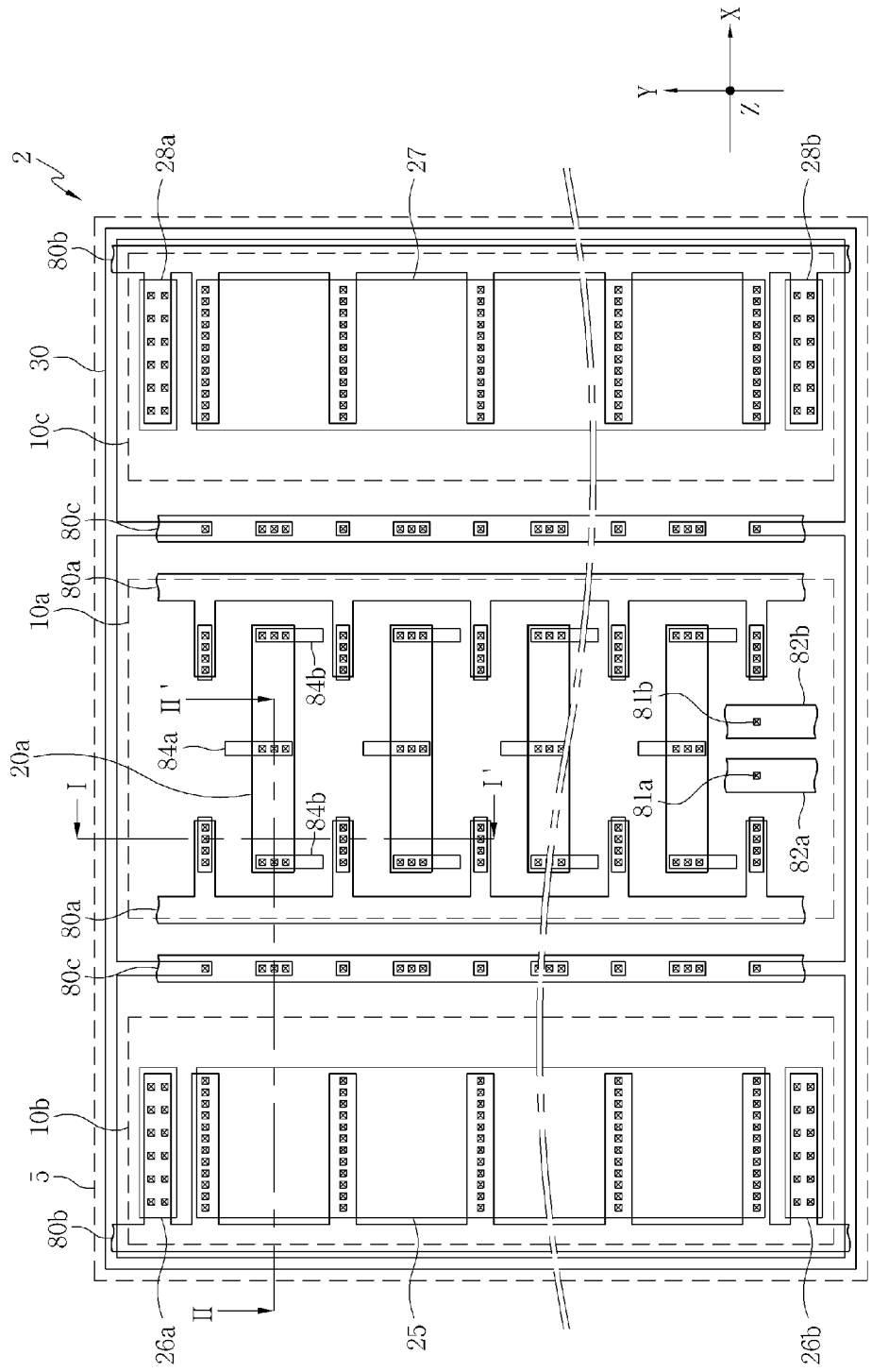
Figure 2D:
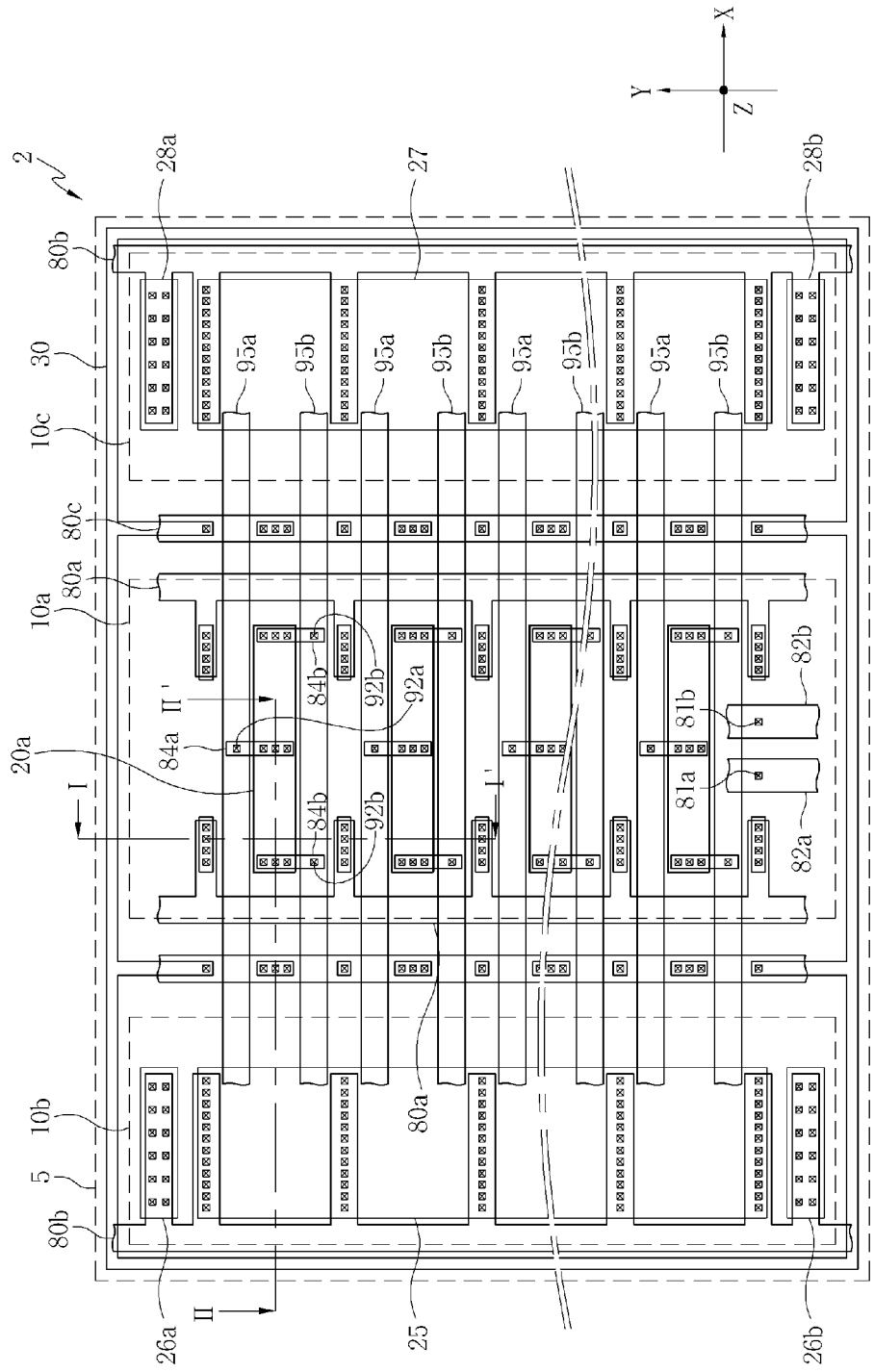
Figure 3A:
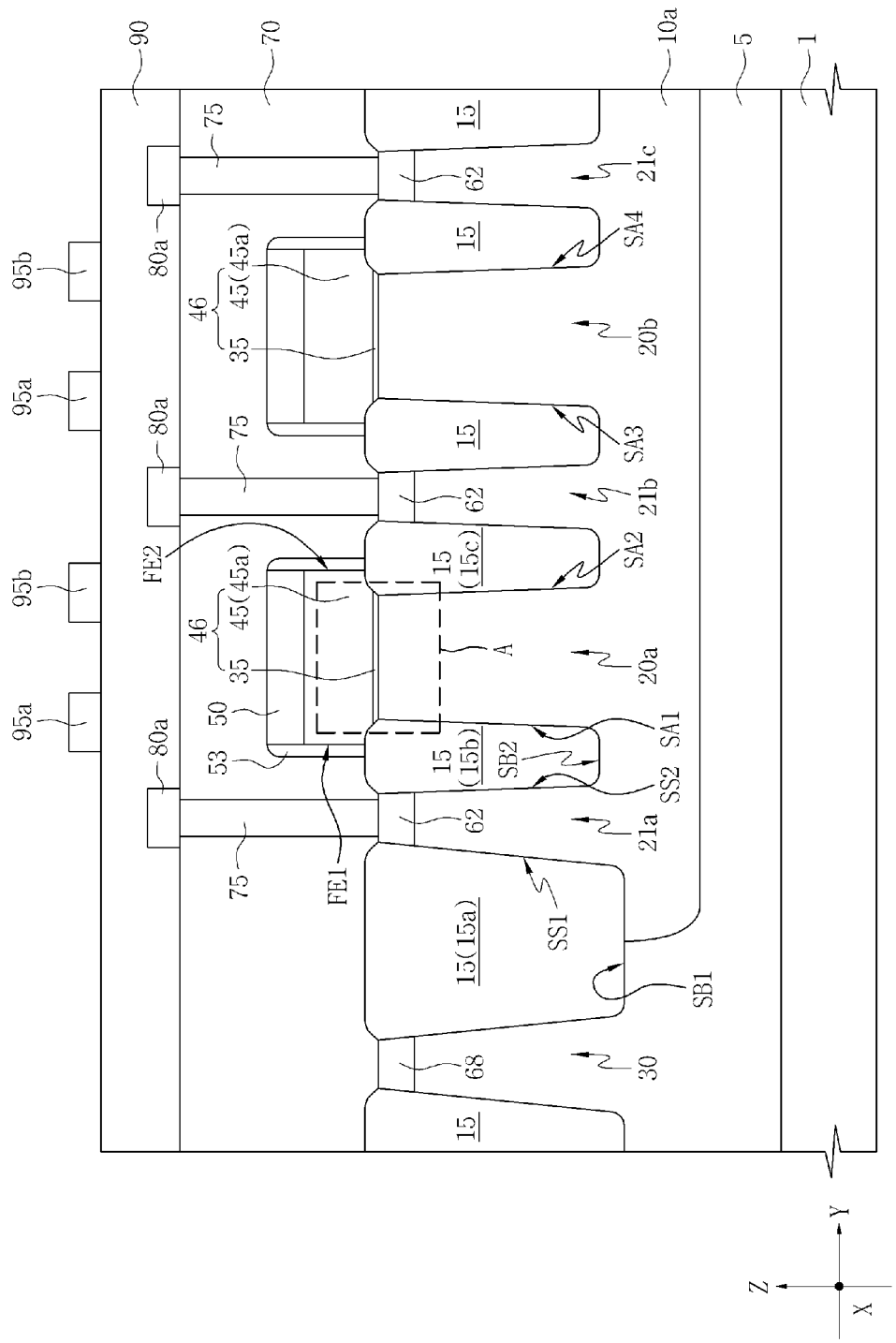
FIGS. 3A and 3B are cross-sectional views of a semiconductor device according to exemplary embodiments of the present general inventive concept.

FIG. 1 is a plan view of a semiconductor device according to at least one exemplary embodiment of the present general inventive concept, FIG. 2A, for convenience of description, is a plan view of active regions and well regions of FIG. 1, FIG. 2B, for convenience of description, is a plan view of a floating gate and an access gate based on FIG. 2A, FIG. 2C, for convenience of description, is a plan view of lower interconnections based on FIG. 2A, and FIG. 2D, for convenience of description, is a plan view of upper interconnections based on FIG. 2C. FIG. 3A is a cross-sectional view taken along line I-I' of FIG. 1, and FIG. 3B is a cross-sectional view taken along line II-II' of FIG. 1.

Figure 3B:
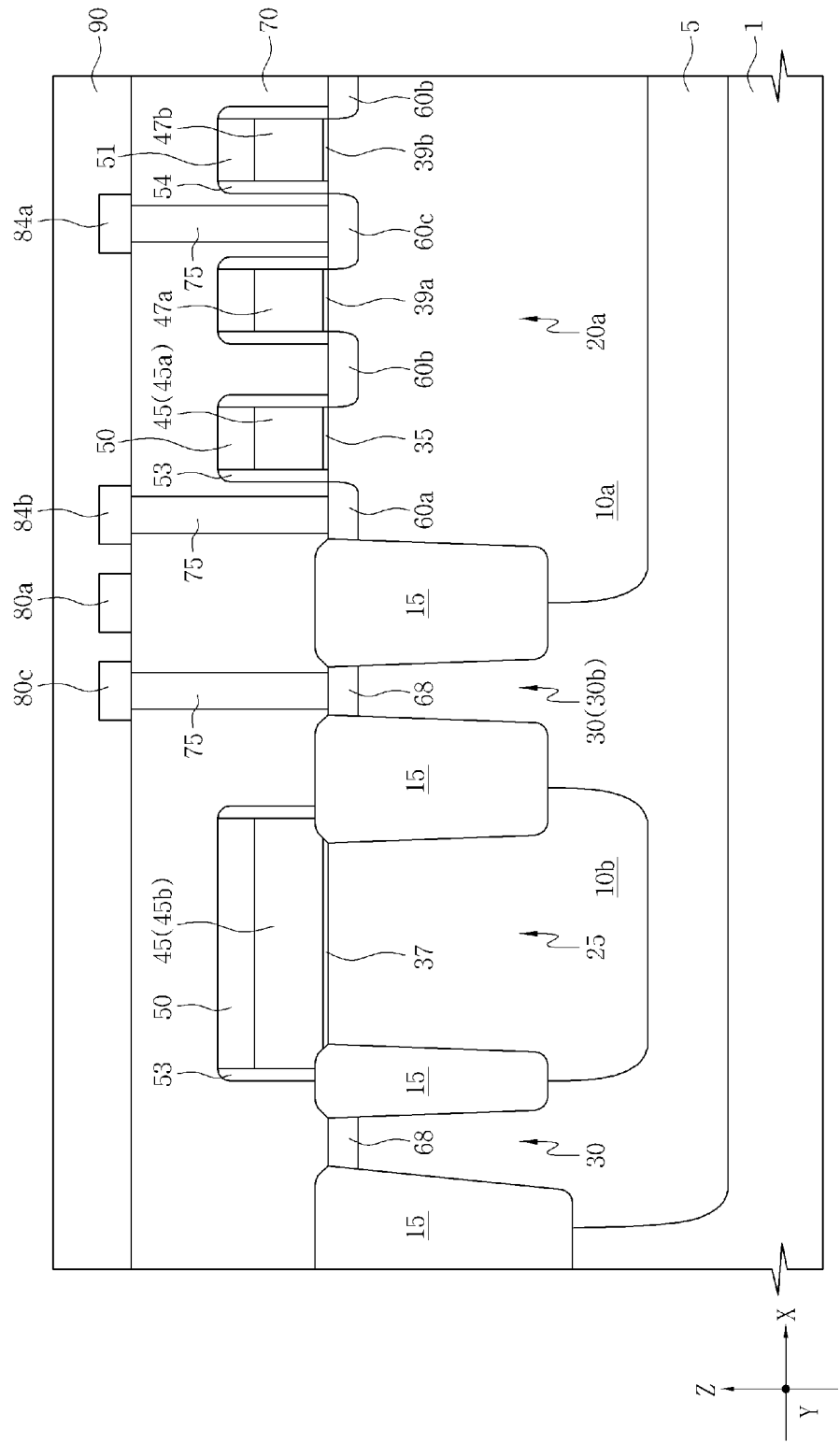

Referring to FIGS. 1, 3A and 3B, exemplary embodiments according to the present general inventive concept will be described.

First, referring to FIGS. 2A, 3A and 3B, the description below will focus on active regions, an isolation region and well regions.

Referring to FIGS. 2A, 3A and 3B, a semiconductor substrate 1 may be provided. The semiconductor substrate 1 may be a silicon substrate. The semiconductor substrate 1 may be an N- or P-type. For example, the semiconductor substrate 1 may be a P-type silicon substrate.

A guard well region 5 having a different conductivity type from the semiconductor substrate 1 may be provided in the semiconductor substrate 1. For example, when the semiconductor substrate 1 has a P-type conductivity, the guard well region 5 may have an N-type conductivity.

A plurality of well regions spaced apart from each other may be provided in the guard well region 5. The well regions may include a first well region 10a provided in the guard well region 5, a second well region 10b provided at one side of the first well region 10a, and a third well region 10c disposed opposite to the second well region 10b with the first well region 10a interposed therebetween. The first to third well regions 10a, 10b, and 10c may be disposed in an X-axis direction, and may be spaced apart from one another.

The first to third well regions 10a to 10c may have a different conductivity type from the guard well region 5. For example, when the guard well region 5 is an N-type well, the first to third well regions 10a to 10c may be a P-type well.

The first to third well regions 10a to 10c may have a shallower junction than the guard well region 5. The first to third well regions 10a to 10c may have a first junction depth, and the guard well region 5 may have a second junction deeper than the first junction. Therefore, the first to third well regions 10a to 10c may be surrounded by the guard well region 5, and may be spaced apart from one another. The first to third well regions 10a to 10c may be spaced apart from one another by the guard well region 5.

An isolation region 15 defining the plurality of active regions may be provided in the semiconductor substrate 1. The isolation region 15 may include a side wall, a side surface and a bottom surface, as described in greater detail below. However, the structure of isolation region 15 is not limited thereto. The plurality of active regions may include a guard active region 30, control active regions 25, auxiliary-control active regions 26, main active regions 20, auxiliary active regions 21 and ancillary active regions 22. These active regions are described in greater detail below.

The control active regions 25 may include a first control active region 25 defined by the isolation region 15 in the second well region 10b, and a second control active region 27 defined by the isolation region 15 in the third well region 10c.

The auxiliary-control active regions 26 may include first auxiliary-control active regions 26a and 26b defined by the isolation region 15 in the second well region 10b and spaced apart from the first control active region 25, and may include second auxiliary-control active regions 28a and 28b defined by the isolation region 15 in the third well region 10c and spaced apart from the second active region 27.

The first control active region 25 may be disposed between the first auxiliary-control active regions 26a and 26b. The first auxiliary-control active regions 26a and 26b and the first control active region 25 disposed therebetween may be arranged along a Y-axis direction perpendicular to the X-axis.

The first auxiliary-control active regions 26a and 26b may be spaced apart from the first control active region 25 by the same distance. The second active region 27 may be disposed between the second auxiliary-control active regions 28a and 28b. The second auxiliary-control active regions 28a and 28b and the second active region 27 disposed therebetween may be arranged along the Y-axis direction.

The main active regions 20 may be defined by the isolation region 15 in the first well region 10a. The main active regions 20 may include first to fourth main active regions 20a, 20b, 20c, and 20d arranged sequentially along the Y-axis direction. For example, on the planar surface, the first main active region 20a may be provided, and the second to fourth main active regions 20b to 20d may be sequentially arranged below the first main active region 20a.

In at least one exemplary embodiment, the number of the main active regions is described to be four for easy understanding of the present general inventive concept. However, the present general inventive concept is not limited to the number. For example, in one cell array block, an access gate line may be designed to cross 32 or more main active regions 20, so that four or more main active regions e.g., 20a-20d may be disposed in one cell block in one direction.

On a planar surface, the auxiliary active regions 21 may include a first auxiliary active region 21a, and second to fifth auxiliary active regions 21b, 21c, 21d and 21e sequentially arranged in the Y-axis direction with respect to the first auxiliary active region 21a. Furthermore, on the planar surface, the auxiliary active regions may include a first ancillary active region 22a spaced apart from the first auxiliary active region 21a in the X-axis direction, and second to fifth ancillary active regions 22b, 22c, 22d, and 22e sequentially arranged in the Y-axis direction with respect to the first ancillary active region 22a. The first to fifth auxiliary active regions 21a to 21e have a mirror-symmetric structure with respect to the first to fifth ancillary active regions 22a to 22e with respect to the Y-axis.

A pair of auxiliary active regions 21a-21e and/or ancillary active regions 22a-22e may be adjacent to a side surface (SA) of an active region 20a-20d selected from the main active regions 20. More specifically, the first main active region 20a disposed at an end portion of the main active regions 20 may include a first side surface SA1 and a second side surface SA2 facing each other. That is, each of the main regions 20a-20d may include opposing first and second side surfaces SA1/SA2. Further, the pair of first auxiliary and ancillary active regions 21a and 22a may be provided adjacent to the first side surface SA1 of the first main active region 20a, and the pair of second auxiliary and ancillary active regions 21b and 22b may be provided adjacent to the second side surface SA2 of the first main active region 20a. The first side surface SA1 of the may be opposite the second side surface SA2.

The second main active region 20b disposed at a middle portion of the main active regions 20 may include a third side surface SA3 adjacent to the first main active region 20a, and a fourth side surface SA4 facing the third side surface SA3. The pair of second auxiliary and ancillary active regions 21b and 22b may be provided adjacent to the third side surface SA3 of the second main active region 20b, and the pair of third auxiliary and ancillary active regions 21c and 22c may be provided adjacent to the fourth side surface SA4 of the second main active region 20b.

The pair of second auxiliary and ancillary active regions 21b and 22b may be disposed between the first main active region 20a and the second main active region 20b. Also, the third auxiliary and ancillary active regions 21c and 22c may be disposed between the second main active region 20b and the third main active region 20c. Therefore, each of the auxiliary active regions 21a-21e and ancillary active regions 22a-22e disposed at the middle portion of the auxiliary active regions may be disposed between main active regions 20 spaced apart from each other by the same distance at both sides.

The guard active region 30 may surround the first to third well regions 10a, 10b and 10c, and may include a first portion 30a extending between the first to third well regions 10a to 10c, and second portions 30b and 30c provided in an island type between the well regions 10a to 10c. Here, when viewed from a planar surface, the second portions 30b and 30c are in an island type, and when viewed from a cross-sectional view, the second portions 30b and 30c may be provided in the guard well region 5. Further, the second portions 30b and 30c may include portions 30b having a first length, and portions 30c having a second length shorter than the first length. Among the second portions 30b and 30c of the guard active region 30, the portions 30c having the second length may be disposed between the main active regions 20a to 20d and the first and second control active regions 25 and 27.

Viewing the active regions arranged in the Y-axis direction, the first auxiliary active region 21a adjacent to the first side surface SA1 of the first main active region 20a may be disposed, and a guard active region 30 disposed opposite to the first main active region 20a with the first auxiliary active region 21a interposed therebetween and adjacent to the first auxiliary active region 21a may be provided.

Viewing the active regions arranged in the Y-axis direction, the first main active region 20a may be spaced apart from the first auxiliary active region 21a by a first distance D1, and the first auxiliary active region 21a may be spaced apart from the guard active region 30 by a second distance D2 greater than the first distance D1.

Viewing the active regions arranged in the Y-axis direction, the second auxiliary active region 21b adjacent to the second side surface SA2 of the first main active region 20a may be disposed, and the second main active region 20b disposed opposite to the first main active region 20a with the second auxiliary active region 21b interposed therebetween and adjacent to the second auxiliary active region 21b may be provided. The first main active region 20a may be spaced apart from the second auxiliary active region 21b by the first distance D1, and the second auxiliary active region 21b may be spaced apart from the second main active region 20b by the first distance D1.

Moreover, viewing the active regions arranged in the Y-axis direction, the distance between the first main active region 20a and the guard active region 30 may be greater than that between the first main active region 20a and the second main active region 20b.

Meanwhile, the first to fourth active regions 20a to 20d may be formed in the same size. Also, each of the first to fifth auxiliary active regions 21a to 21e and the first to fifth ancillary active regions 22a to 22e may be smaller than one main active region 20. For example, the first main active region 20a may be formed to a first width W1, and the first auxiliary active region 21a may be formed to a second width W2 smaller than the first width W1. In addition, the first main active region 20a may have a first planar area, and the first auxiliary active region 21a may have a second planar area smaller than the first planar area.

Referring to FIG. 3A, a plurality of isolation regions 15 may define the active regions arranged in the Y-axis direction. The plurality of isolation regions 15 may include a first isolation region 15a disposed between the guard active region 30 and the first auxiliary active region 21a, a second isolation region 15b disposed between the first auxiliary active region 21a and the first main active region 20a, and a third isolation region 15c disposed between the first main active region 20a and the second auxiliary active region 21b.

The first auxiliary active region 21a may have a first sidewall SS1 adjacent to the first isolation region 15a, and a second sidewall SS2 adjacent to the second isolation region 15b. The first sidewall SS1 of the first auxiliary active region 21a may have a first inclination, and the second sidewall SS2 of the first auxiliary active region 21a may have a second inclination different from the first inclination. For example, the first sidewall SS1 of the first auxiliary active region 21a may be more gradual than the second sidewall SS2 of the first auxiliary active region 21a. The first auxiliary active region 21a may have the first sidewall SS1 of the first inclination, and the second sidewall SS2 of the second inclination greater than the first inclination. Further, a bottom portion (SB1) of the first isolation region 15a may be disposed lower than a bottom portion (SB2) of the second isolation region 15b.

Referring now to FIGS. 2B, 3A and 3B, a floating gate 45 and a gate line 47 included in the exemplary embodiment illustrated in FIG. 1, will be described in greater detail.

A first gate line 47a and a second gate line 47b crossing the main active regions 20a to 20d may be provided. The first and second gate lines 47a and 47b may be parallel to and spaced apart from each other. On a planar surface, the first and second gate lines 47a and 47b may be spaced apart from the auxiliary active regions 20a to 20e and 21a to 21e.

First floating gates disposed opposite to the second gate line 47b with the first gate line 47a interposed therebetween may be provided. Further, second floating gates disposed opposite to the first gate line 47a with the second gate line 47b interposed therebetween may be provided. The first floating gates and the second floating gates may be disposed to have a mirror-symmetric structure with respect to the first and second gate lines 47a and 47b. The floating gates may be spaced apart from each other.

The floating gates 45 may be formed of a material layer to store data of a non-volatile memory device. For example, each of the floating gates may be formed of a material layer, e.g., a polysilicon layer, to store data of a non-volatile memory device such as an EEPROM.

For easy understanding of the present general inventive concept, the description below will focus on one of the floating gates, and the first main active region 20a of a plurality of main active regions 20.

At least one of the floating gates 45 may include a conductive pattern having first and second side portions 48a/48b facing each other. The first side portion 48a may be disposed between a first auxiliary active region 21a and a corresponding main active region 20a, and the second side portion 48b may be disposed between a second auxiliary active region 21b and the main active region 20a. A plurality of conductive sub-patterns may form the conductive pattern. For example, the conductive pattern may include a first conductive pattern 45a crossing the first main active region 20a and extending on the isolation region 15, a second conductive pattern 45b crossing the first control active region 25, and connection patterns 45c and 45d electrically connecting the first conductive pattern 45a to the second conductive pattern 45b. In at least one exemplary embodiment of the present general inventive concept, the floating gate 45 included in the main active region 20 may be overlapped by portions of the main active region 20, as discussed in greater detail. For example, opposing sidewalls SA1/SA2 of the isolation region 15 may overlap respective side portions of the floating gate 45. However, the overlapping arrangement is not limited thereto.

In at least one exemplary embodiment, the connection patterns 45c and 45d may include a first connection portion 45c and a second connection portion 45d parallel to each other. The first connection portion 45c may connect a first end portion FE1 of the first conductive pattern 45a disposed between the first main active region 20a and the first auxiliary active region 21a to the second conductive pattern 45b, and the second connection portion 45d may connect a second end portion FE2 of the first conductive pattern 45a disposed between the first main active region 20a and the second auxiliary active region 21b to the second conductive pattern 45b.

On the planar surface, an overlapping area OA2 between the second conductive pattern 45b and the first control active region 25 may be greater than an overlapping area OA1 between the first conductive pattern 45a and the first main active region 20a. For example, the overlapping area OA2 between the second conductive pattern 45b and the first control active region 25 may be about 10 to 40 times the size of the overlapping area OA1 between the first conductive pattern 45a and the first main active region 20a.

The overlapping area OA1 between the first conductive pattern 45a and the first main active region 20a may be determined by multiplying a first length L1 by a first width W1, and the overlapping area OA2 between the second conductive pattern 45b and the first control active region 25 may be determined by multiplying a second length L3 by a second width W3. Here, the first length L1 may be a width of the first conductive pattern 45a in the X-axis direction, and the first width W1 may be a width of the first main active region 20a in the Y-axis direction. Further, the second length L3 may be a width of the first control active region 25 in the X-axis direction, and the second width W3 may be a width of the second conductive pattern 45b in the Y-axis direction.

The width L1 of the first conductive pattern 45a may be smaller than the length L2 of the auxiliary active regions 21a to 21e.

The overlapping portion between the first conductive pattern 45a and the first main active region 20a may be disposed between a middle portion of the first auxiliary active region 21a and a middle portion of the second auxiliary active region 21b.

In the first main active region 20a, profiles of the facing first and second sidewalls SA1 and SA2 of the first main active regions 20a overlapping the floating gate 45 may be the same. Also, in a cell array of a memory device, the profiles of the facing first and second sidewalls SA1 and SA2 of the first main active regions 20a of a cell disposed at the outermost of the cell array may be the same as those of the facing first and second sidewalls of the second main active region 20b of a cell disposed in the middle of a cell array.

An insulating first capping mask 50 covering a top surface of the floating gate 45 may be provided. An insulating first sidewall spacer 53 may be provided on a sidewall of the floating gate 45. A second capping mask 51 may be provided on top surfaces of the first and second gate lines 47a and 47b, and a second sidewall spacer 54 may be provided on sidewalls of the first and second gate lines 47a and 47b. The first and second capping masks 50 and 51 may include an insulating material such as silicon oxynitride (SiON) or silicon nitride (SiN), and the first and second sidewall spacers 53 and 54 may include an insulating material such as SiON or silicon nitride SiN.

A first gate dielectric layer 39a may be provided between the first gate line 47a and the main active regions 20a to 20d, and a second gate dielectric layer 39b may be provided between the second gate line 47b and the main active regions 20a to 20d. The first and second gate dielectric layers 39a and 39b may be formed of silicon oxide.

A tunnel insulating layer 35 may be provided between the first conductive pattern 45a of the floating gate 45 and the first main active region 20a, and a gate insulating layer 37 may be provided between the floating gate 45 and the first control active region 25. The tunnel insulating layer 35 and the first conductive pattern 45a may be defined as a gate pattern 46. The tunnel insulating layer 35 and the gate insulating layer 37 may be formed of silicon oxide.

Figure 4:
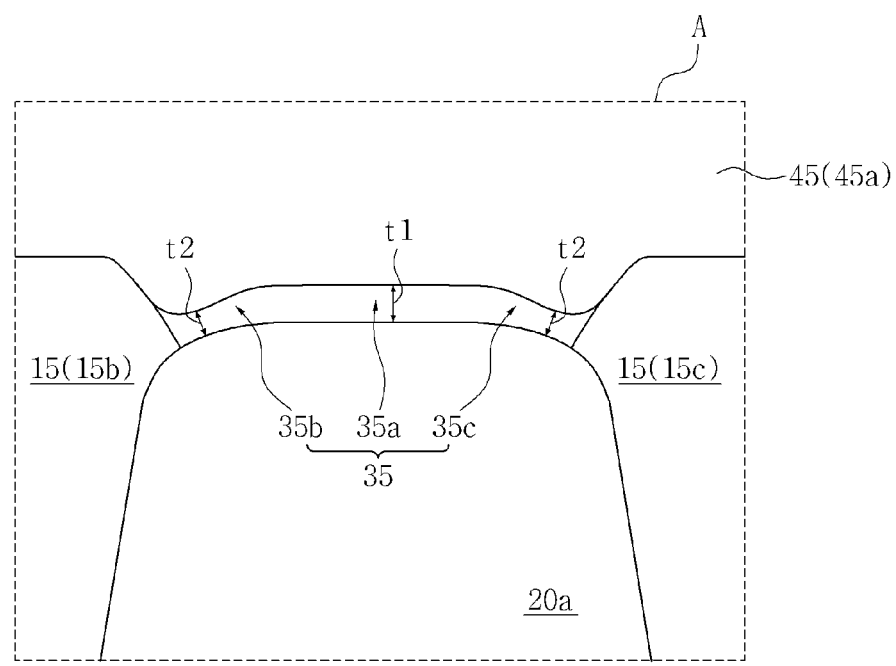
FIG. 4 is a cross-sectional view of a part of a semiconductor device according to at least one exemplary embodiment of the present general inventive concept.

In at least one exemplary embodiment, as illustrated in FIG. 4, the tunnel insulating layer 35 may include a first tunnel portion, a second tunnel portion and a third tunnel portion. For example, the tunnel insulating layer 35 may include first and second end tunnel portions disposed adjacent to first and second sides of opposing insulation portions 15, respectively, and a middle tunnel portion disposed between the first and second end tunnel portions. The first tunnel portion 35a may have a first thickness t1 on the middle portion of the main active region 20a. The second tunnel portion 35b provided at a first edge portion of the first main active region 20a adjacent to the second portion 15b of the isolation region 15 may have a second thickness t2. The third tunnel portion 35c provided at a second edge portion of the first main active region 20a adjacent to the third portion 15c of the isolation region 15 may also have the second thickness t2. That is, the first thickness t1 may of the first tunnel portion 35a may be greater than the second thickness t2 of the second and third tunnel portions 35b, 35c. Here, FIG. 4 is an enlarged view of a tunnel insulating layer area "A" of FIG. 3A.

A common impurity region 60c may be provided in the main active regions 20a to 20d between the first and second gate lines 47a and 47b. The common impurity region 60c may have a different conductivity type from the first well region 10a.

A first impurity region 60a and a second impurity region 60b may be provided in the first main active region 20a at both sides of the first portion 45a of the floating gate 45 crossing the first main active region 20a. The second impurity region 60b may be adjacent to the first gate line 47a. The first impurity region 60a may be disposed at an end portion of the first main active region 20a.

The first and second impurity regions 60a and 60b may have the same conductivity type and impurity concentration as the common impurity region 60c. The first and second impurity regions 60a and 60b may be regions having the same high impurity concentration as a source/drain of a transistor.

Control impurity regions of a high concentration may be provided in the first and second control active regions 25 and 27 at both sides of the floating gate 45. The control impurity regions may have the same conductivity type and impurity concentration as the first and second impurity regions 60a and 60b. The first and second impurity regions 60a and 60b, the common impurity region 60c and the control impurity regions may have a different conductivity type from the first to third well regions 10a to 10c. For example, when the first to third well regions 10a to 10c are a P-type, the first and second impurity regions 60a and 60b, the common impurity region 60c and the control impurity regions may be an N-type.

Auxiliary impurity regions 62 having a high concentration may be provided in upper regions of the auxiliary active regions 21a to 21e, and the ancillary active regions 22a to 22e. The auxiliary impurity regions 62 may have the same conductivity type as the first well region 10a, and may have a higher impurity concentration than the first well region 10a. For example, the auxiliary impurity regions 62 may be a P-type. However, this arrangement is not limited thereto.

A guard impurity region 68 may be provided in upper regions of the guard active regions 30. The guard impurity region 68 may have the same conductivity type as and a higher impurity concentration than the guard well region 5. For example, the guard impurity region 68 may be an N-type, but is not limited thereto.

Auxiliary-control impurity regions having the same conductivity type as and a higher impurity concentration than the first to third well regions 10b and 10c may be provided in upper regions of the auxiliary-control active regions 26a, 26b, 28a, and 28b.

Next, the description below will focus on lower interconnections of the components illustrated in FIG. 1 with reference to FIGS. 2C, 3A and 3B.

Referring to FIGS. 2C, 3A and 3B, a first interlayer insulating layer 70 may be provided on the semiconductor substrate having the floating gate 45 and the gate lines 47a and 47b.

First interconnections 80a electrically connected to the auxiliary impurity regions 62 may be provided on the first interlayer insulating layer 70.

Second interconnections 80b electrically connected to the auxiliary-control impurity regions may be provided on the first interlayer insulating layer 70. Here, the auxiliary-control impurity regions may represent impurity regions formed in the upper regions of the auxiliary-control active regions 26a, 26b, 28a and 28b.

A third interconnection 80c electrically connected to the guard impurity regions 68 may be provided on the first interlayer insulating layer 70. The first to third interconnections 80a to 80c may be spaced apart from each other, and may be electrically connected to lower impurity regions by contact structures 75 penetrating the first interlayer insulating layer 70. The contact structures 75 may be contact plugs formed of a metal material such as tungsten.

A first pad 84a electrically connected to the common impurity region 60c, and a second pad 84b electrically connected to the first impurity region 60a may be provided on the first interlayer insulating layer 70. The contact structures 75 penetrating the first interlayer insulating layer 70, and electrically connecting between the first and second pads 84a and 84b and the first and common impurity regions 60a and 60c may be provided.

When viewed from a planar surface, the first and second pads 84a and 84b may be parallel to each other, and may be spaced apart from each other. Also, when viewed from a planar surface, while the first and second pads 84a and 84b may overlap the first main active region 20a, the first and second pads 84a and 84b may protrude from the first main active region 20a in different directions from each other. For example, the first pad 84a may protrude from the first main active region 20a towards the first auxiliary active region 21a, and the second pad 84b may protrude from the first main active region 20b towards the second auxiliary active region 21b.

Fourth and fifth interconnections 82a and 82b electrically connected to the first and second gate lines 47a and 47b may be provided on the first interlayer insulating layer 70. The fourth and fifth interconnections 82a and 82b may be electrically connected to the first and second gate lines 47a and 47b by the first and second gate contact structures 81a and 81b penetrating the first interlayer insulating layer 70 and the second capping masks 51.

An upper interconnection of the components illustrated in FIG. 1 will be described in greater detail below with reference to FIGS. 2D, 3A and 3B.

Referring to FIGS. 2A, 3A and 3B, a second interlayer insulating layer 90 covering the first to third interconnections 80a to 80c and the first and second pads 84a and 84b may be provided on the first interlayer insulating layer 70. Sixth and seventh interconnections 95a and 95b parallel to each other may be provided on the second interlayer insulating layer 90. The sixth interconnection 95a may be electrically connected to the first pad 84a, and the seventh interconnection 95b may be electrically connected to the second pad 84b.

The sixth interconnection 95a may be electrically connected to the first pad 84a by a first contact structure 92a penetrating the second interlayer insulating layer 90, and the seventh interconnection 95b may be electrically connected to the second pad 84b by a second contact structure 92b penetrating the second interlayer insulating layer 90.

When viewed from a planar surface, the sixth and seventh interconnections 95a and 95b may cross the fourth and fifth interconnections 82a and 82b.

Figure 5:
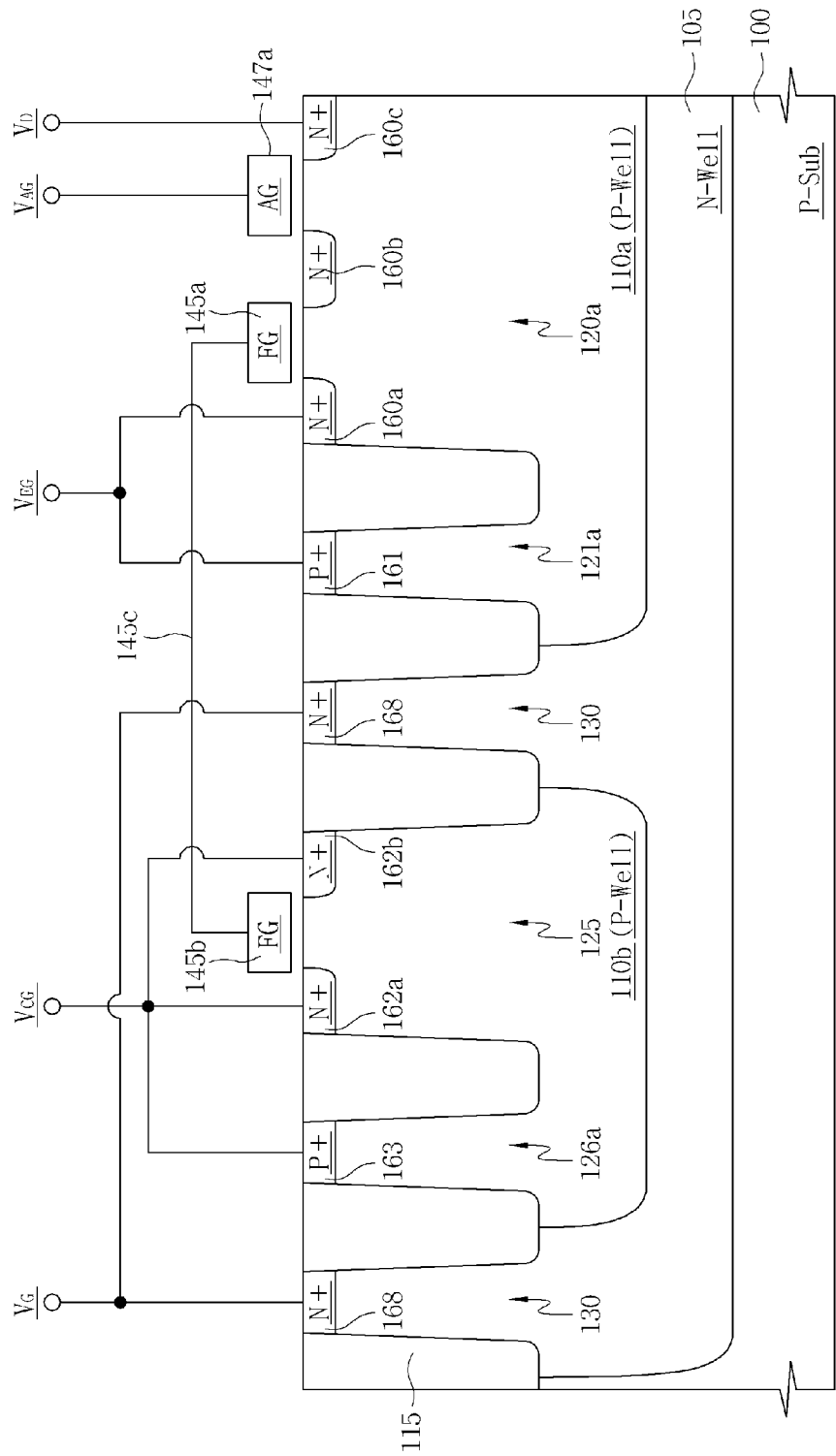
FIG. 5 is a schematic view illustrating an operating method of a semiconductor device according to at least one exemplary embodiment of the present general inventive concept.

FIG. 5, with reference to FIGS. 1 to 4, schematically illustrates a method of operating a semiconductor device according to at least one exemplary embodiment of the present general inventive concept. In particular, FIG. 5 schematically illustrates a method of operating a unit cell of a non-volatile memory device according to at least one exemplary embodiment of the present general inventive concept. Therefore, FIG. 5 is a schematic view for easy understanding of the electrical connections of the components illustrated in FIGS. 1 to 4.

The description below will focus on FIG. 5, and with reference to FIGS. 1 to 4, a method of operating a semiconductor device and the constitution thereof according to at least one exemplary embodiment of the present general inventive concept will be described below.

Referring to FIG. 5, as illustrated in FIGS. 1 to 4, a guard well region 105 may be provided in a semiconductor substrate 100, and a first well region 110a and a second well region 110b spaced apart from each other may be provided in the guard well region 105. In at least one exemplary embodiment illustrated in FIGS. 1-4, the guard well region 105 may be an N-type well, and the first and second well regions 110a and 110b may be a P-type well. It can be appreciated, however, that the semiconductor device is not limited thereto. For example, the guard well region 105 may be an P-type well, and the first and second well regions 110a and 110b may be a N-type well.

An isolation region 115 defining a guard active region 130 in the guard well region 105, a main active region 120a and an auxiliary active region 121a in the first well region 110a, and a control active region 125 and an auxiliary-control active region 126a in the second well region 110b may be provided.

A first conductive pattern 145a overlapping the main active region 120a, and a second conductive pattern 145b overlapping the control active region 125 may be provided. The first and second conductive patterns 145a and 145b may be electrically connected by a connection pattern 145c. The first and second conductive patterns 145a and 145b and the connection pattern 145c may be defined as floating gates (FG). The first and second conductive patterns 145a and 145b and the connection pattern 145c may correspond to the first and second conductive patterns 45a and 45b and the connection pattern 45b of the floating gate 45 described in FIGS. 1 to 4, respectively.

A gate line 147a crossing the main active region 120a and spaced apart from the first conductive pattern 145a may be provided. The gate line 147a may correspond to the first gate line 47a described in FIGS. 1 to 3. The gate line 147a may be defined as an access gate (AG) of an access transistor.

A guard impurity region 168 may be provided in an upper region of the guard active region 130, an auxiliary impurity region 161 may be provided in an upper region of the auxiliary active region 121a, and an auxiliary-control impurity region 163 may be provided in the auxiliary-control active region 126a. Also, first and second impurity regions 160a and 160b may be provided in the main active region 120a at both sides of the first conductive pattern 145a of the floating gate, a common impurity region 160c may be provided in the main active region 120a disposed opposite to the second impurity region 160b with the gate line 147a interposed therebetween, and a first control impurity region 162a and a second control impurity region 162b may be provided in the control active region 125 at both sides of the second conductive pattern 145b of the floating gate.

The auxiliary-control impurity region 163 may be electrically connected to the first and second impurity regions 162a and 162b by an interconnection. For example, the auxiliary-control impurity region 163 may be electrically connected to the first and second control impurity regions 162a and 162b by the second interconnection 80b as described in FIG. 2C. The second impurity region 160b may be floated in the main active region 120a.

When the semiconductor device according to at least one exemplary embodiment of the present general inventive concept includes a multi time programmable (MTP) cell in an electrically erasable programmable read only memory (EE- PROM) type, erase and program operations may be performed using a Fowler-Nordheim (F-N) tunneling phenomenon.

The F-N tunneling phenomenon may occur between the first conductive pattern 145a of the floating gates 145a, 145b and 145c and the main active region 120a. For example, the F-N tunneling phenomenon may occur in the second and third tunnel portions 35b and 35c which are thinner than the first tunnel portion 35a in the tunnel insulating layer 35 disposed between the first conductive pattern 145a and the main active region 120a (refer to FIG. 4).

Terminals $V_G$, $V_{CG}$, $V_{EG}$, $V_{AG}$, and $V_D$ electrically connected to the impurity regions and the gate operate the semiconductor device according to at least one exemplary embodiment of the present general inventive concept may be provided. The terminals $V_G$, $V_{CG}$, $V_{EG}$, $V_{AG}$, and $V_D$ may apply an electrical signal to the components 168, 163, 162a, 162b, 161, 160a, and 160c via the interconnections described in FIGS. 1 to 3B. Since the interconnections have been previously described in FIGS. 1 to 3B, the detailed description thereof will be omitted.

The cell may exist in an erase state or a program state according to a threshold voltage (Vth). In the erase state, the cell may have a relatively low voltage, for example, a threshold voltage lower than 0V. Meanwhile, the cell may have a relatively high voltage in the program state, for example, a threshold voltage higher than 0V. A the cell may also operate in a read operation, which requires the state of a cell to be distinguished, i.e., a determination as whether the cell is in an erase state or a program state. The state determination may be accomplished by applying a read voltage to a selected cell to detect whether the selected cell is turned on or off. For example, a voltage of 0V is applied to a word line of the selected cell. That is, if the selected cell is turned on, the selected cell may be in the erase state because the threshold voltage is lower than the read voltage. Meanwhile, if the selected cell is turned off, the selected cell may be in the program state because the threshold voltage is higher than the read voltage. It can be appreciated that a selected cell may be in the program state when the selected cell is turned on, and may be in the erase state when the selected cell is turned off, without deviating from the general scope described above.

The erase operation may include grounding the control active region 125, floating the gate line 147a, floating the common impurity region 160c and the first impurity region 160a, and applying an erase voltage to the first main active region 120a at a lower portion of the first conductive pattern 145a. In this case, the erase voltage may be a positive voltage. Further, grounding the control active region 125 may denote grounding of the auxiliary-control impurity region 163 having the same conductivity type as and a higher impurity concentration than the control active region 125. The auxiliary-control impurity region 163 may be in a state of 0V. The erase voltage may be between 15V and 25V. As a result, an F-N tunneling phenomenon may occur between the first conductive pattern 145a and the first main active region 120a. More specifically, electrons in the floating gate including the first conductive pattern 145a may be injected into the main active region 120a by the F-N tunneling phenomenon. Therefore, electrons in the floating gates 145a, 145b and 145c may be erased.

The program operation may include grounding the gate line 147a, the common impurity region 160c, the first impurity region 160a, and the first main active region 120a at the lower portion of the first conductive pattern 145a, and applying a program voltage to the control active region 125. The program voltage may be a positive voltage lower than the erase voltage. For example, when the erase voltage is between 15V and 25V, the program voltage may be 10V to 20V lower than the erase voltage. Therefore, during the program operation, electrons in the main active region 120a may be injected into the floating gate, i.e., the first conductive pattern 145a by the F-N tunneling phenomenon.

The floating gate 45 described in FIGS. 2B, 3A and 3B may include a first conductive pattern 45a crossing the first main active region 20a and extending on the isolation region 15, a second conductive pattern 45b crossing the first control active region 25, and connection portions 45c and 45d electrically connecting the first conductive pattern 45a to the second conductive pattern 45b. The floating gate 45 may be variously modified within the scope of the present general inventive concept. In particular, the connection portions 45c and 45d of the floating gate 45 may be variously modified.

The description below will focus on the modified connection portion of the floating gate 45 with reference to FIGS. 6 to 8.

Figure 6:
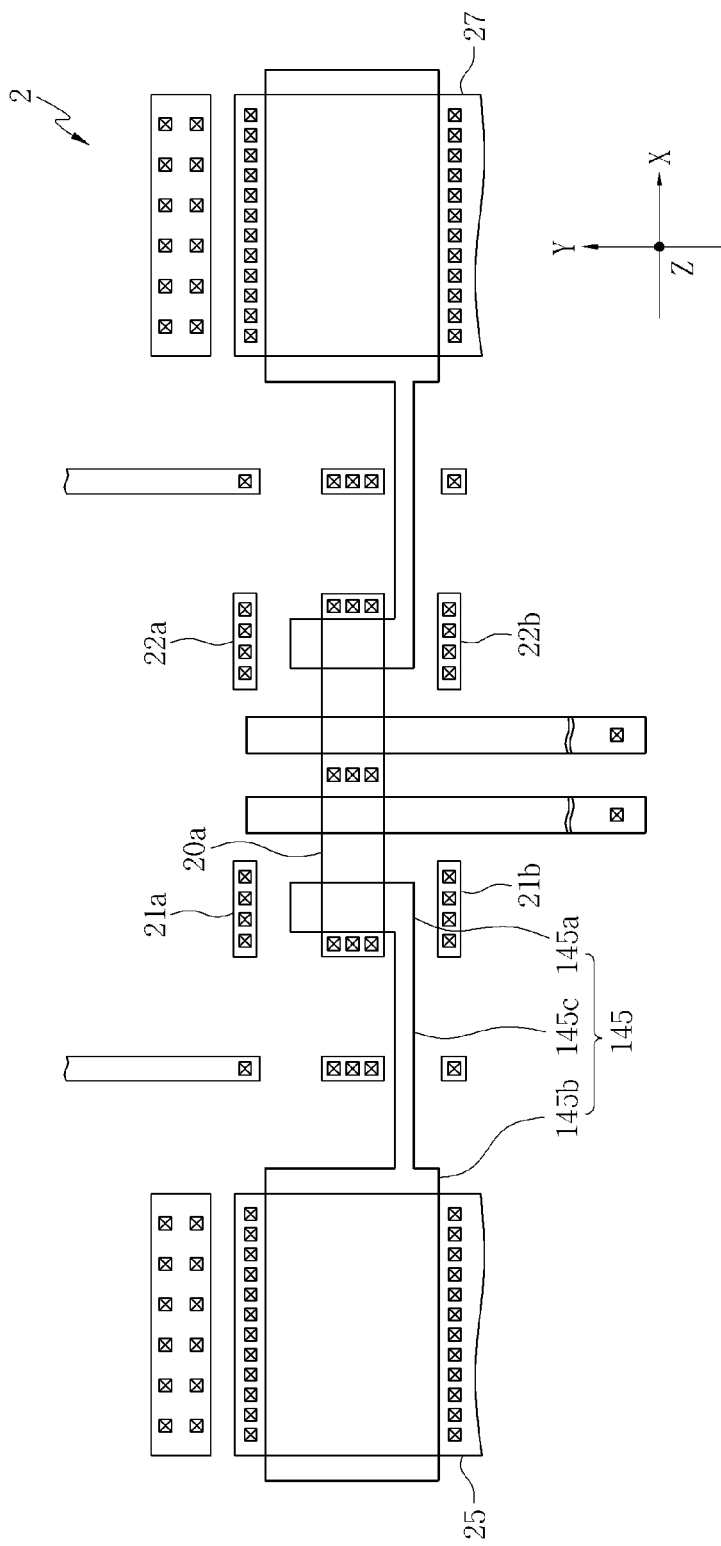
FIG. 6 is a plan view of a semiconductor device according to at least one exemplary embodiment of the present general inventive concept.

Referring to FIG. 6, a floating gate 145 may include a first conductive pattern 145a crossing the first main active region 20a and extending on the isolation region 15, a second conductive pattern 145b crossing the first control active region 25, and a connection portion 145c electrically connecting the first conductive pattern 145a to the second conductive pattern 145b. The connection portion 145c is in a single line shape, and may electrically connect one end of the first conductive pattern 145a to the second conductive pattern 145c.

Figure 7:
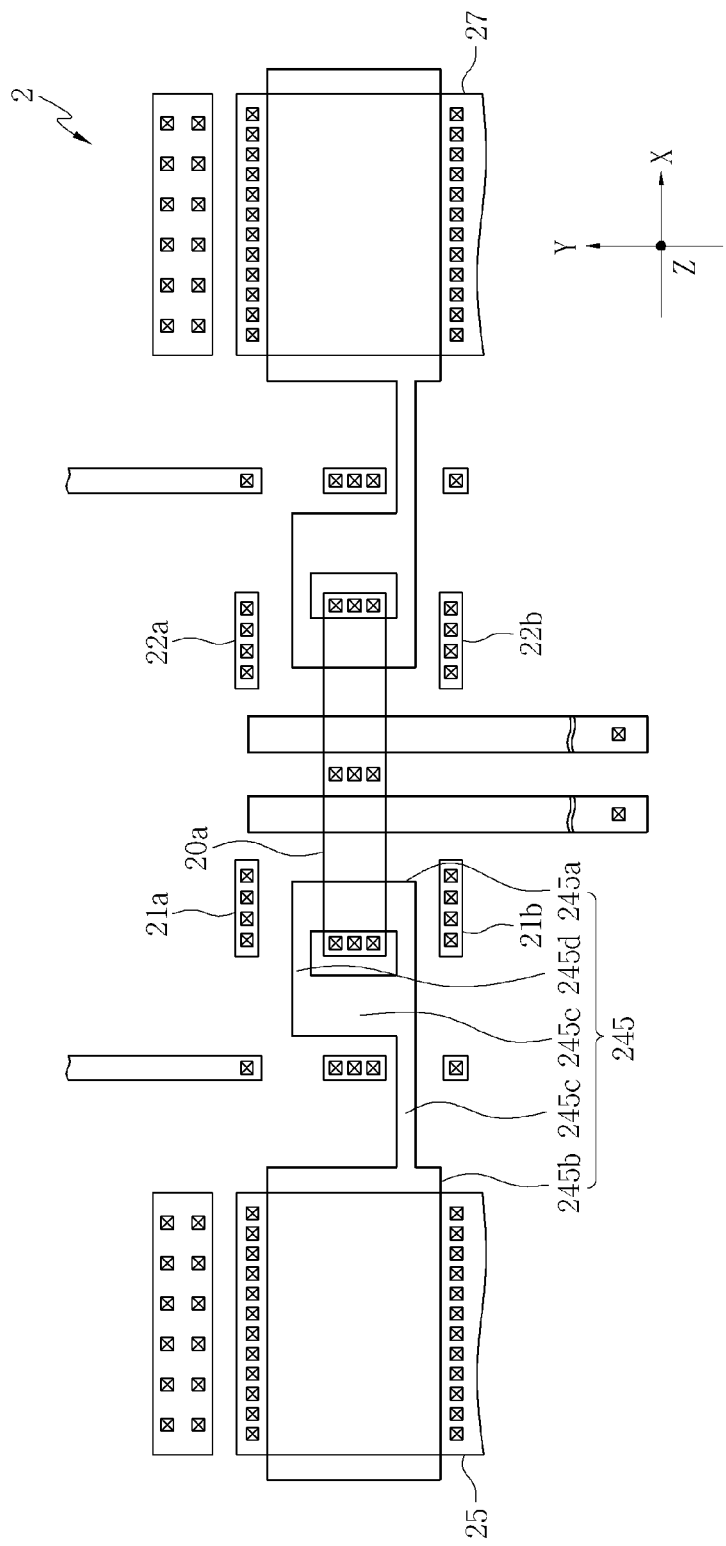
FIG. 7 is a plan view of a semiconductor device according to at least one exemplary embodiment of the present general inventive concept.

Referring to FIG. 7, a floating gate 245 may include a first conductive pattern 145a crossing the first main active region 20a and extending on the isolation region 15, a second conductive pattern 145b crossing the first control active region 25, and connection portions 245c, 245d and 245e electrically connecting the first conductive pattern 145a to the second conductive pattern 145b. The connection portions 245c, 245d and 245e may include a first connection portion 245c connecting one end of the first conductive pattern 145a to the second conductive pattern 245b, a second connection portion 245d connected to the other end of the first conductive pattern 145a and not directly connected to the second conductive pattern, and a third connection portion 245e connecting a middle portion of the first connection portion 245c to the second connection portion 245d.

Figure 8:
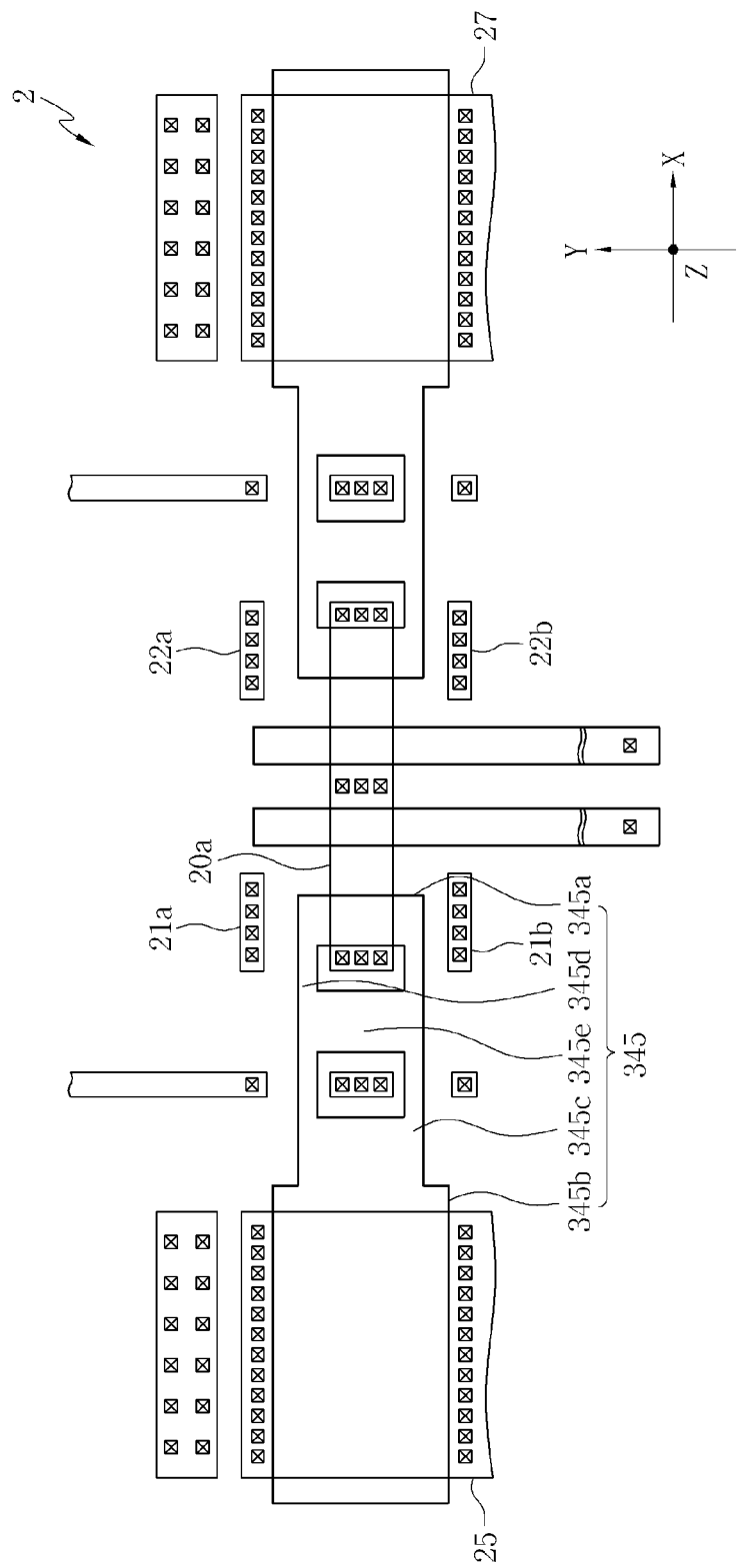
FIG. 8 is a plan view of a semiconductor device according to at least one exemplary embodiment of the present general inventive concept.

Referring to FIG. 8, a floating gate 345 may include a first conductive pattern 345a crossing the first main active region 20a and extending on the isolation region 15, a second conductive pattern 345b crossing the first control active region 25 and connection portions 345c, 345d and 345e electrically connecting the first conductive pattern 345a to the second conductive pattern 345b. The connection portions 345c, 345d and 345e may include a first connection portion 345c connecting one end of the first conductive pattern 345a to the second conductive pattern 345b, a second connection portion 345d connecting the other end of the first conductive pattern 345a to the second conductive pattern 345b and parallel to the first connection portion 345c, and a third connection portion 345e connecting middle portions of the first and second connection portions 345c and 345d.

Figure 9A:
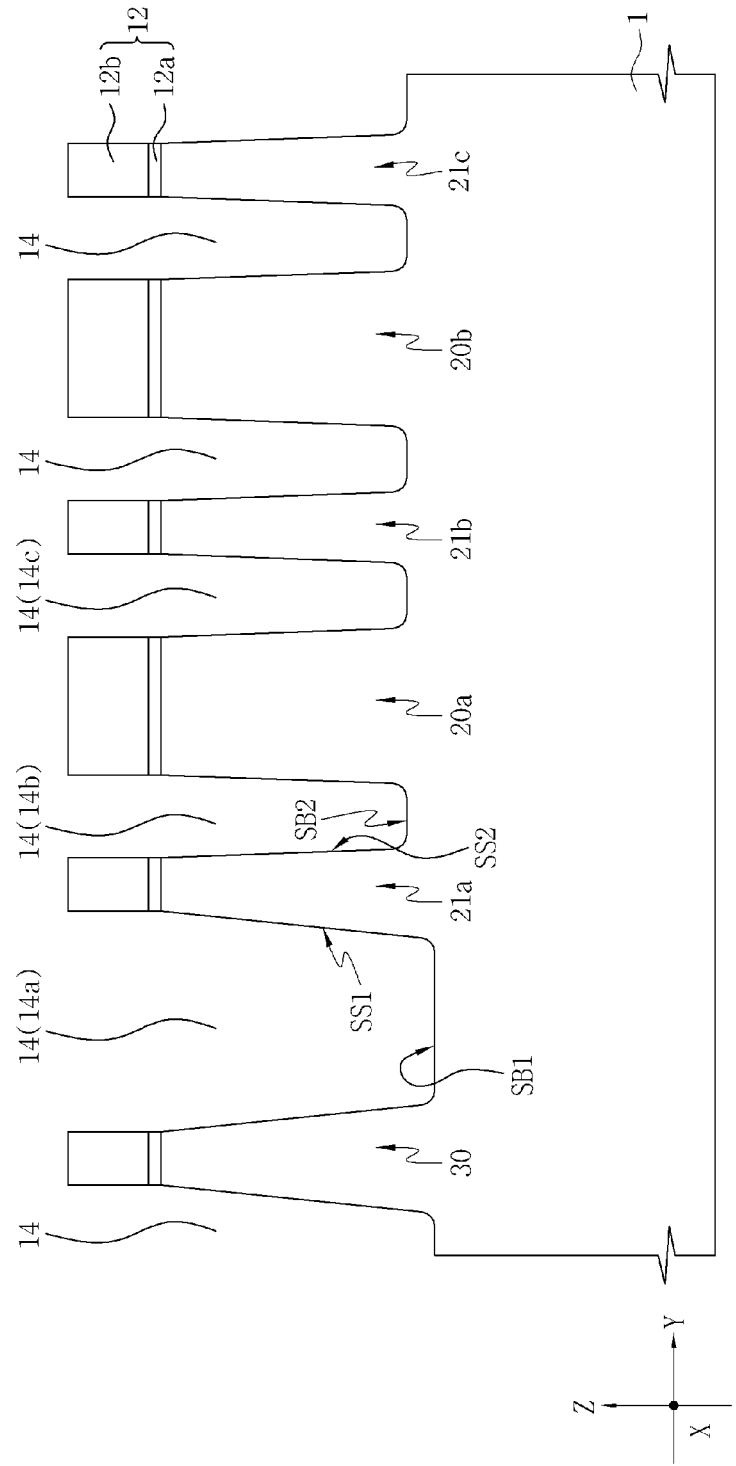
Figure 10A:
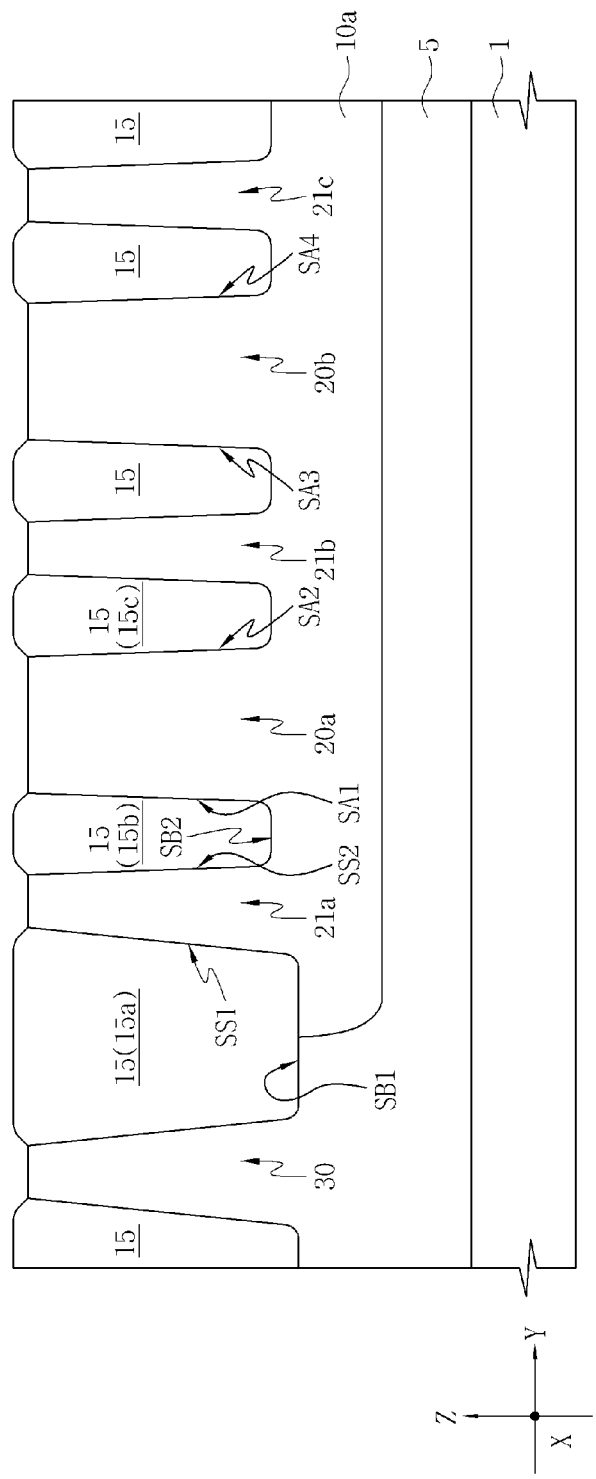
Figure 10B:
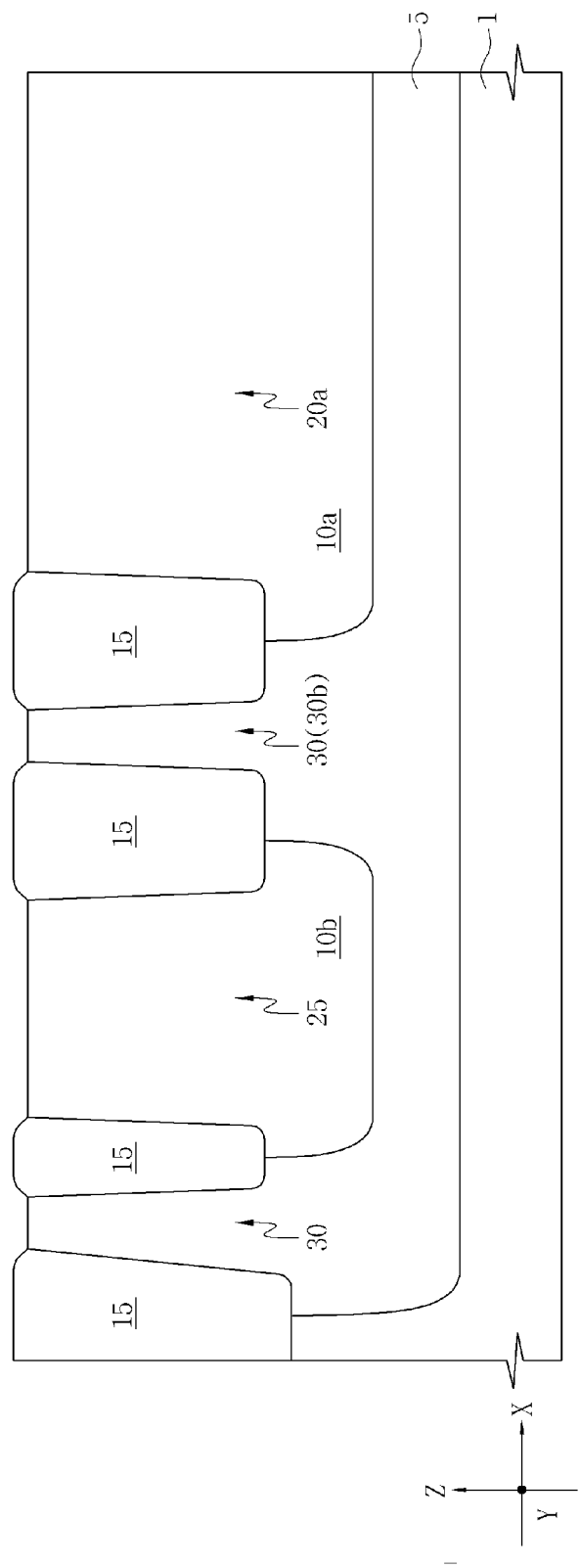
Figure 11A:
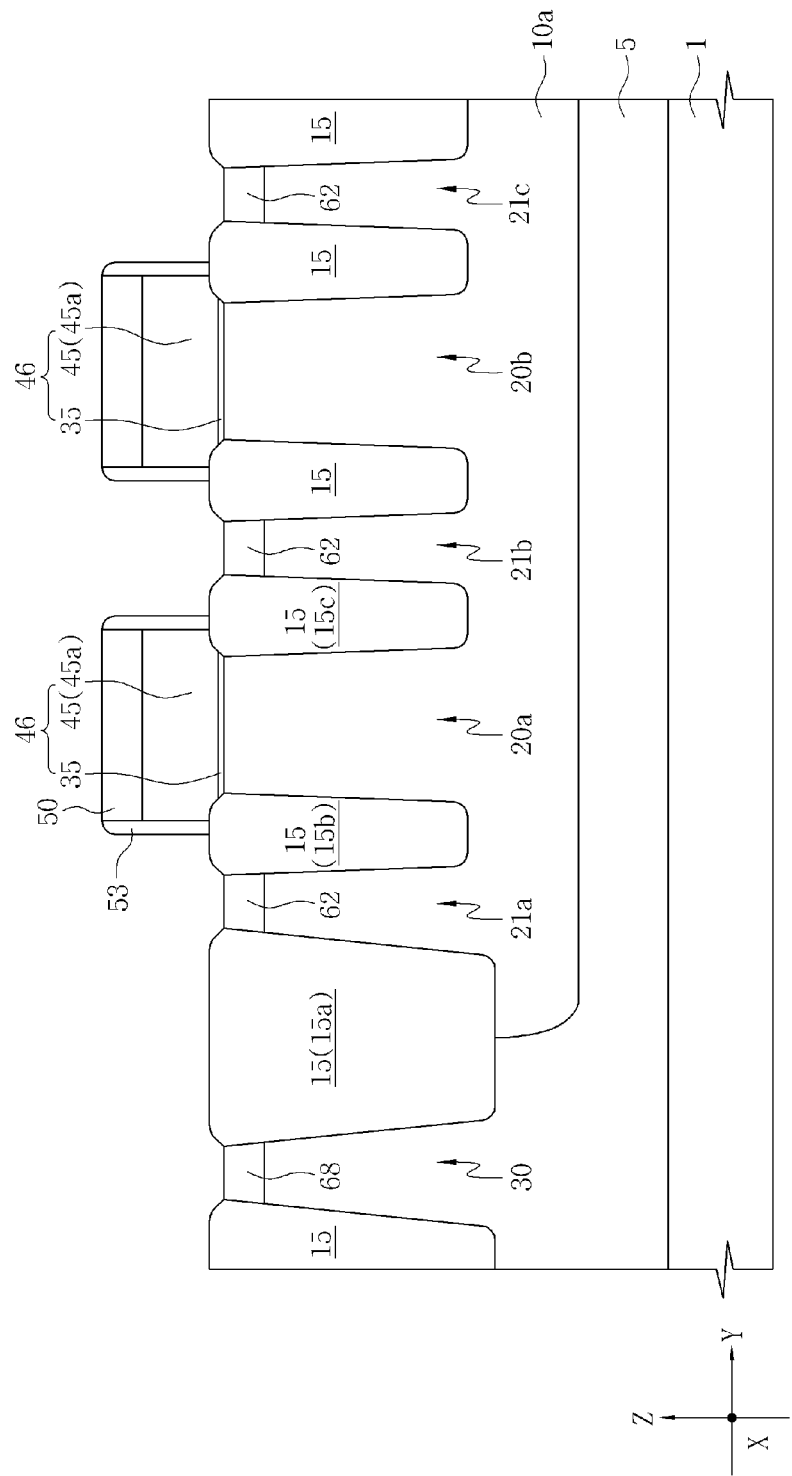
Figure 11B:
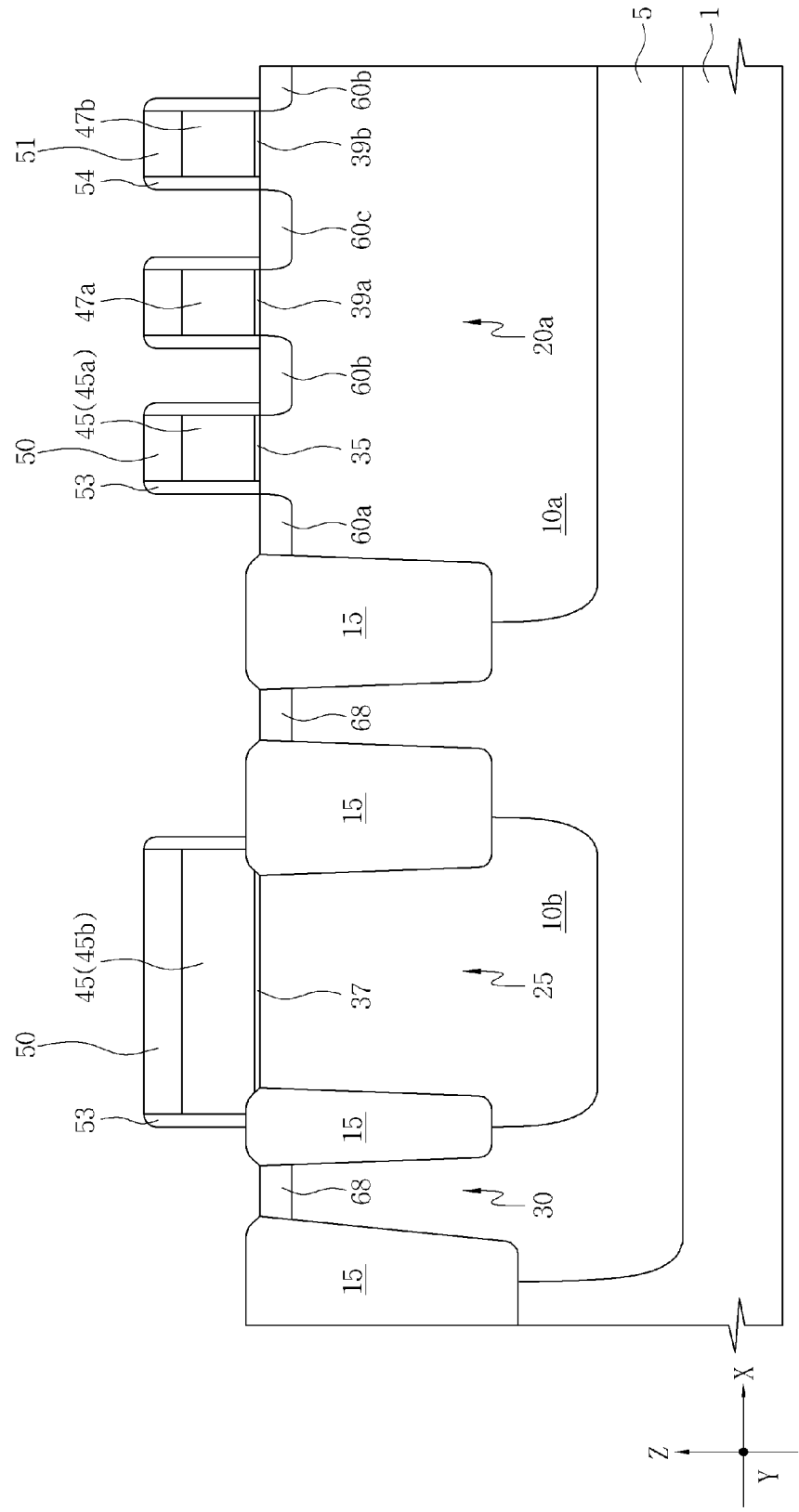
Figure 12A:
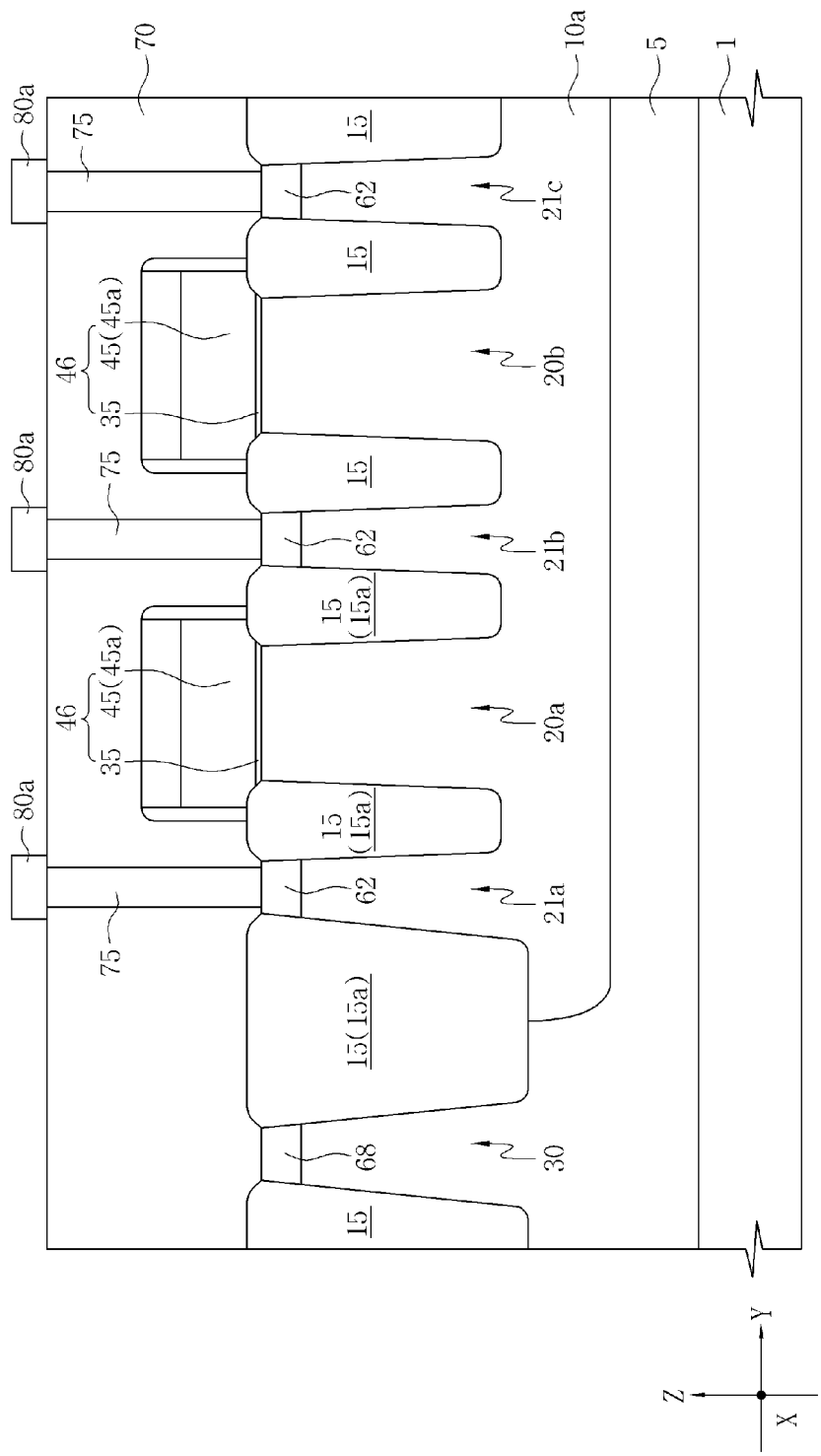
Figure 12B:
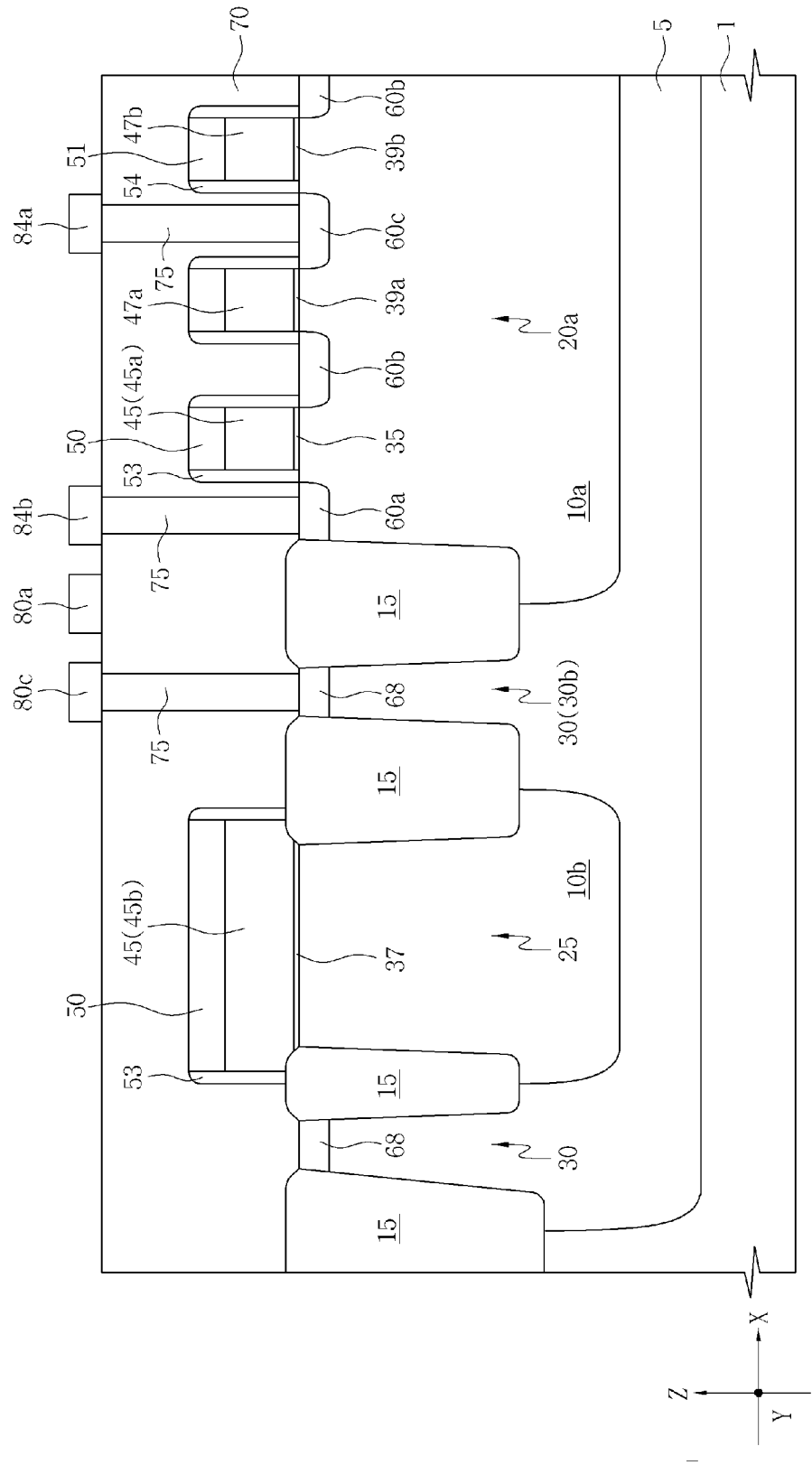

Next, a method of fabricating the semiconductor device described in FIGS. 1 to 3B will be described with reference to FIGS. 9A to 11B. Here, FIGS. 9A, 10A and 11A are cross-sectional views taken along line I-I' of FIG. 1, and FIGS. 9B, 10B, and 11B are cross-sectional views taken along line II-II' of FIG. 1.

Referring to FIGS. 1, 2A, 9A and 9B, a semiconductor substrate 1 may be prepared. The semiconductor substrate 1 may be a silicon substrate. The semiconductor substrate 1 may be an N-type or P-type. For example, the semiconductor substrate 1 may be a P-type silicon substrate.

Hard masks 12 may be formed on the semiconductor substrate 1. Each of the hard masks 12 may include a buffer pattern 12a and a mask pattern 12b which are sequentially stacked. For example, the buffer pattern 12a may be formed of a thermal oxide layer, and the mask pattern 12b may be formed of a silicon nitride (SiN) layer or a silicon oxide nitride (SiON) layer. Here, the thermal oxide layer may be formed of a silicon oxide layer.

The hard masks 12 may be used as etch masks to etch the semiconductor substrate 1. As a result, a plurality of trenches 14 may be formed. The etching may employ a dry etching process.

The trenches 14 may include a first trench 14a and a second trench 14b. The first trench 14a may have a greater width then the second trench 14b. The first trench 14a having a relatively great width may be formed to have a sidewall SS1 of a more gradual inclination than the second trench 14b. The second trench 14b may be formed to have a sidewall SS2 of a more gradual inclination than the sidewall SS1 of the first trench 14a. The first trench 14a may have a first bottom region SB1, and the second trench 14b may have a second bottom region SB2 disposed at a higher level than the first bottom region SB1.

The etching speed of a semiconductor substrate 1 having a great distance between the hard masks 12 may be different from that of a semiconductor substrate 1 having a narrow distance between the hard masks 12. Therefore, an etch loading effect may cause the first and second trenches 14a and 14b having different sidewall inclinations and bottom regions disposed at different levels during the dry etching of the semiconductor substrate 1.

Second and third trenches 14b and 14c disposed at both sides of the first main active region 20a may be formed to have the same width. The second and third trenches 14b and 14c may have the same sidewall inclination and bottom regions disposed at the same level.

Referring to FIGS. 1, 2A, 10A and 10B, as a result of the etching process to form the trenches 14, a silicon oxide layer may be formed on the bottom regions and sidewalls of the trenches 14 using a thermal oxidation process such that etching damage on the bottom regions and sidewalls of the trenches 14 is cured.

An isolation region 15 may be formed by performing a process of filling the trenches 14 with an insulating material. More specifically, the formation of the isolation region 15 may include forming an isolation insulating layer filling the trenches 14 and covering the semiconductor substrate 1, planarizing the isolation insulating layer until top surfaces of the hard masks 12 are exposed, and removing the hard masks 12 using an etching process. Here, the isolation insulating layer may be a silicon oxide layer.

The plurality of active regions defined by the isolation region 15 are described above with reference to FIGS. 1, 2A, 3A and 3B. Therefore, the description below will focus on a method of forming a semiconductor device, and the detailed description of arrangement of each component constituting the semiconductor device and the structure thereof will be omitted.

A guard well ion implantation process may be performed to form a guard well region 5 having a different conductivity type from the semiconductor substrate 1 in the semiconductor substrate 1. Also, the well ion implantation process may be performed to form first to third well regions 10a, 10b and 10c spaced apart from each other in the guard well region 5.

In at least one exemplary embodiment, the ion implantation process to form the guard well region 5 may be performed after forming the isolation region 15. However, the exemplary embodiments of the present general inventive concept are not limited hereto. For example, before forming the isolation region 15, the ion implantation process to form the guard well region 5 may be performed.

In at least one exemplary embodiment, the ion implantation process to form the first to third well regions 10a to 10c may be performed after forming the isolation region 15. However, the exemplary embodiments of the present general inventive concept are not limited hereto. For example, before forming the isolation region 15, the ion implantation process to form the first to third well regions 10a to 10c may be performed.

In at least one exemplary embodiment, after forming the guard well region 5, the first to third well regions 10a to 10c may be formed. However, the exemplary embodiments of the present general inventive concept are not limited hereto, and the guard well region 5 may be formed after forming the first to third well regions 10a to 10c.

Referring to FIGS. 1, 2B, 11A and 11B, an insulating material layer and a conductive material layer that are sequentially stacked may be formed on the semiconductor substrate 1 having the isolation region 15. The insulating material layer may be a silicon oxide layer formed by a thermal oxidation process. For example, the insulating material may be a silicon oxide layer formed by dry oxidation. The conductive material layer may be a polysilicon layer.

Capping masks 50 and 51 may be formed on the conductive material layer. The capping masks 50 and 51 may be formed of an insulating material such as silicon nitride or silicon oxynitride (SiON). The capping masks 50 and 51 may be used as etch masks to etch the conductive material layer. As a result, the floating gate 45 and the gate lines 47a and 47b described with reference to FIGS. 2B. 3A and 3B may be formed. The floating gate 45 and the gate lines 47a and 47b may be formed of the same material, and may be formed to the same thickness, such that occurrences of dispersion failure of a program threshold voltage may be reduced.

While the insulating material layer may be partially etched during the etching of the conductive material layer, it may remain below the floating gate 45 and the gate lines 47a and 47b. Therefore, the insulating material layer between the floating gate 45 and the main active region 20a may be defined as a tunnel insulating layer 35, the insulating material layer between the floating gate 45 and the control active region 25 may be defined as a gate insulating layer 37, and the insulating material layer between the gate lines 47a and 47b and the main active region 20a may be defined as gate dielectrics 39a and 39b.

A spacer insulating layer may be formed on the semiconductor substrate having the floating gate 45 and the gate lines 47a and 47b, and the spacer insulating layer may be anisotropically etched. Therefore, a first sidewall spacer 53 may be formed on a sidewall of the floating gate 45, and second sidewall spacers 54 may be formed on sidewalls of the gate lines 47a and 47b. The spacer insulating layer may be formed of a silicon nitride layer.

An ion implantation process to form an impurity region of a first conductivity type and a high concentration may be performed to form a guide impurity region 68, first and second impurity regions 60a and 60b, the common impurity region 60c, and first and second control impurity regions. The first conductivity type may be an N-type. The first and second impurity regions 60a and 60b may be formed in the main active region 20a at both sides of the floating gate 45, the common impurity region 60c may be formed in the main active region 20a disposed opposite to the second impurity region 60b with the gate line 47a interposed therebetween, and the first and second control impurity regions may be formed in the control active region 25 at both sides of the floating gate 45.

An ion implantation process to form an impurity region of a second conductivity type and a high concentration may be performed to form an auxiliary impurity region 62, and an auxiliary-control impurity region. The second conductivity type may be different from the first conductivity type. For example, when the first conductivity type is an N-type, the second conductivity type may be a P-type.

The guard impurity region 68 may be formed in an upper region of the guard active region 30, the auxiliary impurity region 62 may be formed in an upper region of the auxiliary active region 21a, and the auxiliary-control impurity region may be formed in an upper region of the auxiliary-control active region 126a.

Referring to FIGS. 1, 2C, 12A and 12B, a first interlayer insulating layer 70 may be formed on the semiconductor substrate having the floating gate 45, the gate lines 47a and 47b and the impurity regions 68, 62, 60a, 60b and 60c. The first interlayer insulating layer 70 may be formed of a silicon oxide layer.

Contact structures 75 penetrating the first interlayer insulating layer 70 and electrically connected to the impurity regions 68, 62, 60a and 60c may be formed. The contact structures 75 may be contact plugs including a metal material such as tungsten (W) and/or titanium nitride (TiN).

An interconnection metal layer may be formed on the first interlayer insulating layer 70, and the interconnection metal layer may be patterned. As a result, first interconnections 80a electrically connected to the auxiliary impurity region 62 may be formed on the first interlayer insulating layer 70, second interconnections 80b electrically connected to the auxiliary-control impurity regions may be formed on the first interlayer insulating layer 70, a third interconnection 80c electrically connected to the guard impurity regions 68 may be formed on the first interlayer insulating layer 70, a first pad 84a electrically connected to the common impurity region 60c and a second pad 84b electrically connected to the first impurity region 60a may be formed on the first interlayer insulating layer 70, and fourth and fifth interconnections 82a and 82b electrically connected to the first and second gate lines 47a and 47b may be formed on the first interlayer insulating layer 70. The relationship between the first to fifth interconnections 80a, 80b, 80c, 82a and 82b, the first and second pads 84a and 84b and the contact structure 75 has been previously described with reference to FIGS. 2C, 3A and 3C. Therefore, the detailed description thereof will be omitted.

Referring back to FIGS. 2D, 3A and 3B, a second interlayer insulating layer 90 covering the first to fifth interconnections 80a, 80b, 80c, 82a and 82b and the first and second pads 84a and 84b may be formed on the first interlayer insulating layer 70.

First and second contact structures 92a and 92b penetrating the second interlayer insulating layer 90 may be formed. Afterwards, sixth and seventh interconnections 95a and 95b respectively covering the first and second contact structures 92a and 92b may be formed on the second interlayer insulating layer 90. The sixth interconnection 95a may be electrically connected to the first pad 84a by the first contact structure 92a, and the seventh interconnection 95b may be electrically connected to the second pad 84b by the second contact structure 92b.

According to at least one exemplary embodiment of the present general inventive concept, in the main active region where an access transistor and a floating gate structure may be formed, a new cell layout enabling profiles of facing first and second sidewalls of the main active region overlapping the floating gate to be the same may be provided, so that cell dispersion characteristics may be improved, and reliable memory cells may be provided. In particular, in a cell array of a memory device, a new layout enabling profiles of facing first and second sidewalls of a main active region in a cell disposed at the outermost of the cell array to be the same as those of facing first and second sidewalls of a main active region in a cell disposed in the middle of the cell array may be provided. Accordingly, a cell layout, and method of providing a cell layout may be provided that enables edge tunnel oxide layers at both edge portions of the active region adjacent the gate structure to be uniformly formed.

Next, an electronic device employing a semiconductor device according to at least one exemplary embodiment of the present general inventive concept will be described with reference to FIG. 13.

Figure 13:
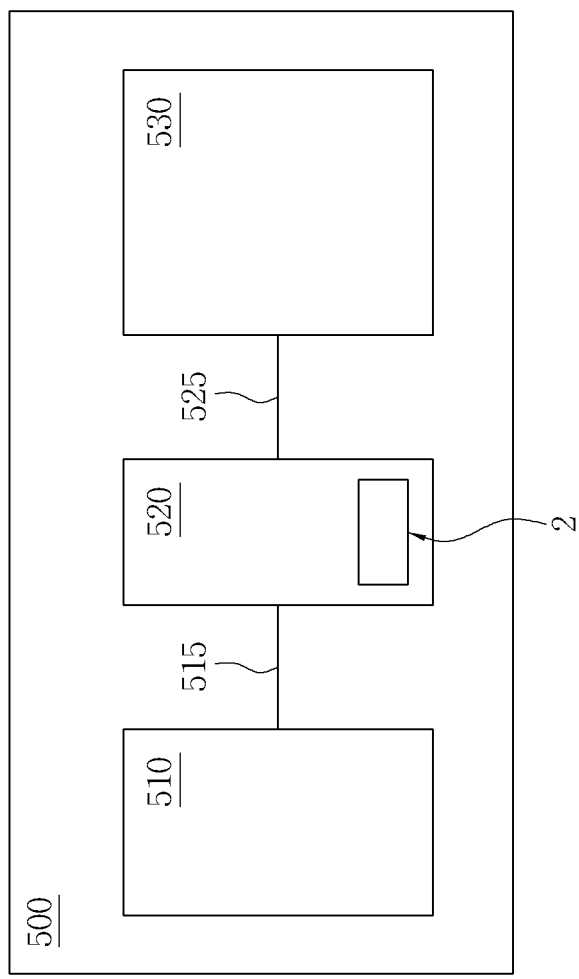
FIG. 13 is a schematic block diagram of an electronic device employing a semiconductor device according to at least one exemplary embodiment of the present general inventive concept.

Referring to FIG. 13, an electronic device 500 may include a display panel 510, a display driver IC 520 and a processing device 530. The display panel 510, the display driver IC 520 and the processing device 530 may be electrically connected by signal lines 515 and 525.

The display driver IC 520 may include one of the various exemplary embodiments of the present general inventive concept as described in FIGS. 1 to 12B. For example, the display driver IC 520 may include an EEPROM-type multi time programmable (MTP) cell, and the MTP cell may be one of the various exemplary embodiments of the present general inventive concept as described in FIGS. 1 to 12B.

The processing device 530 may include a control device and a storage device. For example, the processing device 530 may include a control device such as a microprocessor, and may include at least one different type of storage device such as a hard disk drive storage device, a non-volatile memory (e.g., a flash memory or other EEPROMs), and a volatile memory (e.g., battery-based SDRAM or DRAM).

The electronic device 500 according to the present general inventive concept may be used for all kinds of electronic products including the display panel 510 and the display driver IC 520 electrically connected to the display panel 510. For example, the electronic device 500 may be utilized in a cellular phone 600 as illustrated in FIG. 14 discussed further below.

Figure 14:
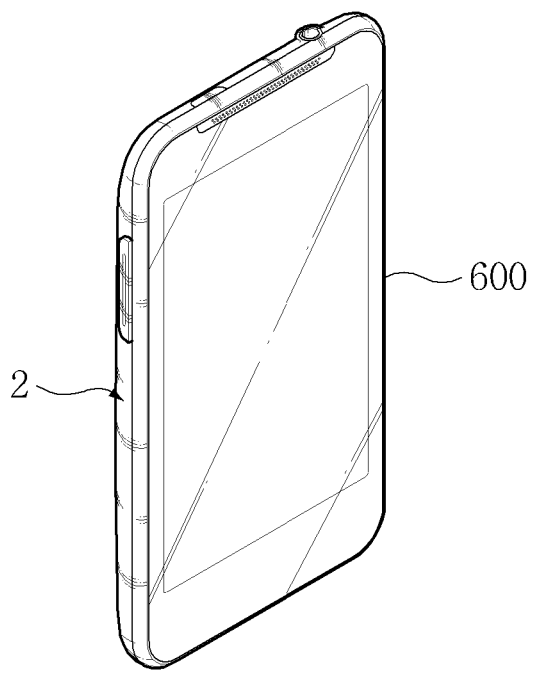
FIG. 14 is a perspective view of an electronic product employing a semiconductor device according to at least one exemplary embodiment of the present general inventive concept.

Referring now to FIG. 14, a perspective view of an electronic product employing a semiconductor device 2 according to at least one exemplary embodiment of the present general inventive concept is shown. In at least one exemplary embodiment, the electronic product includes, but is not limited to, a terminal device capable of wireless communication. For example, the terminal device may include a smartphone, capable of a performing a wide variety of tasks, including, but not limited to, personal digital assistant (PDA) organization and tasking, mobile telephone and data communication, still and/or moving image processing, audio playback and/or processing and global positioning satellite (GPS) navigation.

Although a few exemplary embodiments of the present general inventive concept have been shown and described, it will be appreciated by those skilled in the art that changes may be made in these exemplary embodiments without departing from the principles and spirit of the present general inventive concept, the scope of which is defined in the appended claims and their equivalents.

What is claimed is:

1. A semiconductor device, comprising:
   a semiconductor substrate having a plurality of well regions;
   a plurality of isolation regions in a first well region among the plurality of well regions including a first isolation region and a second isolation region;
   a main active region provided in the first well region of the semiconductor substrate and having a first side surface and a second side surface facing each other;
   a first auxiliary active region in the first well region adjacent to the first side surface of the main active region, and spaced apart from the main active region by a first distance;
   a second auxiliary active region in the first well region adjacent to the second side surface of the main active region, and spaced apart from the main active region by the first distance; and
   a first conductive pattern crossing the main active region,
   wherein the conductive pattern has first and second side portions facing each other, wherein the first side portion of the conductive pattern is disposed between the first auxiliary active region and the main active region, and the second side portion of the conductive pattern is disposed between the second auxiliary active region and the main active region,
   the first isolation region is disposed between the main active region and the first auxiliary active region in the first well region, and
   the second isolation region is disposed between the main active region and the second auxiliary active region in the first well region.

2. The device according to claim 1, wherein the first or second auxiliary active region has a different width from the main active region.

3. The device according to claim 1, wherein the first conductive pattern has a smaller width in a first direction than a width in the first direction of the first auxiliary active region on a planar surface.

4. The device according to claim 1, further comprising a control active region spaced apart from the main active region, wherein the main active region and the control active region are arranged along an X-axis direction, and the first auxiliary active region, the main active region and the second auxiliary active region are arranged along a Y-axis direction perpendicular to the X-axis direction.

5. The device according to claim 4, further comprising a second conductive pattern crossing the control active region, and a connection pattern electrically connecting the first conductive pattern to the second conductive pattern.

6. The device according to claim 5, wherein the second conductive pattern and the control active region have an overlapping region therebetween greater than that between the first conductive pattern and the main active region.

7. The device according to claim 5, wherein the connection pattern includes:
   a first connection pattern connected to a first end portion of the first conductive pattern; and
   a second connection pattern connected to a second end portion of the second conductive pattern.

8. The device according to claim 7, wherein the first connection pattern connects the first end portion of the first conductive pattern to the second conductive pattern, the second connection pattern connects the second end portion of the second conductive pattern to the second conductive pattern, and the first and second connection patterns are parallel to each other.

9. The device according to claim 1, further comprising a conductive line crossing the main active region, and spaced apart from the first conductive pattern.

10. The device according to claim 1, further comprising a tunnel dielectric between the first conductive pattern and the main active region,
    wherein the tunnel dielectric includes a first tunnel dielectric provided in a middle portion of the main active region, and a second tunnel dielectric provided in an edge portion of the main active region, the first tunnel dielectric being thicker than the second tunnel dielectric.

11. A semiconductor device, comprising:
    a substrate having a plurality of well regions;
    a first active region provided in a first well region among the plurality of well regions of the substrate;
    a second active region spaced apart from the first active region by a first distance;
    a third active region spaced apart from the first active region and located in the first well region;
    a fourth active region spaced apart from the second active region; and
    a fifth active region spaced apart from the third active region; and
    the plurality of isolation regions defining the first to fifth active regions, the plurality of isolation regions including a first isolation region, a second isolation region, a third isolation region and a fourth isolation region, the plurality of isolation regions located at least partially within the first well region,
    wherein the first active region is disposed between the second active region and the third active region,
    the second active region is disposed between the first active region and the fourth active region,
    the third active region is disposed between the first active region and the fifth active region,
    the first isolation region is disposed between the first active region and the second active region,
    the second isolation region is disposed between the first active region and the third active region,
    the third isolation region is disposed between the second active region and the fourth active region,
    the fourth isolation region is disposed between the third active region and the fifth active region, and
    the fourth active region is spaced apart from the second active region by a second distance that is greater than the first distance.

12. The device according to claim 11, further comprising:
    first impurity regions provided in an upper region of the first active region, and spaced apart from each other;
    a second impurity region provided in an upper region of the second active region;
    a third impurity region provided in an upper region of the third active region;
    a fourth impurity region provided in an upper region of the fourth active region;
    fifth impurity regions provided in an upper region of the fifth active region, and spaced apart from each other; and
    a first conductive pattern provided on the first active region between the first impurity regions.

13. The device according to claim 11, further comprising a first well region,
    wherein the first, second and third active regions are disposed in the first well region, and
    the first and second isolation regions are disposed in the first well region.

14. The device according to claim 11, wherein the fifth active region is spaced apart from the third active region by a third distance that is less than the second distance.

15. A semiconductor device, comprising:
a semiconductor substrate;
a plurality of well regions spaced apart from each other disposed in the semiconductor substrate; and
a plurality of isolation regions defining a plurality of active regions disposed in the semiconductor substrate, the plurality of isolation regions including a first isolation region and a second isolation region,
wherein the plurality of well regions comprises:
  a first well region;
  a second well region disposed at one side of the first well region; and
  a third well region disposed opposite to the second well region with the first well region interposed therebetween,
wherein the plurality of active regions comprises:
  a main active region disposed in the first well region and having a first side surface and a second side surface facing each other;
  a first auxiliary active region disposed in the first well region and adjacent to the first side surface of the main active region;
  a second auxiliary active region disposed in the first well region and adjacent to the second side surface of the main active region;
  a first control active region disposed in the second well region; and
  a second control active region disposed in the third well region, and
wherein the first isolation region is disposed between the main active region and the first auxiliary active region, the second isolation region is disposed between the main active region and the second auxiliary active region, and
each of the first isolation region and the second isolation region is disposed in the first well region.

16. The semiconductor device of claim 15, further comprising:
a first auxiliary-control active region disposed in the second well region and spaced apart from the first control active region; and
a second auxiliary-control active region disposed in the third well region and spaced apart from the second control active region.

17. The semiconductor device of claim 15, wherein the first and second auxiliary active regions have a planar area smaller than a planar area of the main active region.

18. The semiconductor device of claim 15, further comprising a gate line crossing the main active region.

19. The semiconductor device of claim 15, further comprising a floating gate spaced apart from the gate line.

20. The semiconductor device of claim 15, further comprising:
a floating gate; and
an insulating sidewall spacer disposed on a sidewall of the floating gate, the insulating sidewall spacer contacting either the first isolation region or the second isolation region.

* * * * *